United States Patent [19]
Sasaki et al.

[11] Patent Number: 5,970,368
[45] Date of Patent: Oct. 19, 1999

[54] METHOD FOR MANUFACTURING POLYCRYSTAL SEMICONDUCTOR FILM

[75] Inventors: Hideyuki Sasaki, Yokohama; Michihiro Oose, Kawasaki; Isao Suzuki, Kimitsu; Shiro Takeno, Yokohama; Mitsuhiro Tomita, Machida; Yoshito Kawakyu, Kawasaki; Yuki Matsuura, Yokohama; Hiroshi Mitsuhashi, Tokyo, all of Japan

[73] Assignee: Kabushiki Kaisha Toshiba, Kawasaki, Japan

[21] Appl. No.: 08/939,660

[22] Filed: Sep. 29, 1997

[30] Foreign Application Priority Data

Sep. 30, 1996 [JP] Japan .................................. 8-259529
Mar. 14, 1997 [JP] Japan .................................. 9-061072

[51] Int. Cl.$^6$ .......................... H01L 21/205; H01L 29/04
[52] U.S. Cl. .................... 438/487; 438/488; 156/617 R; 156/620
[58] Field of Search .................................. 438/488, 150, 438/487; 156/617 R, 620

[56] References Cited

U.S. PATENT DOCUMENTS 4,707,217 11/1987 Aklufi .
5,814,835 11/1995 Makita et al. .
5,827,773 3/1997 Voutsas .

FOREIGN PATENT DOCUMENTS 6-188207 7/1994 Japan .

OTHER PUBLICATIONS

Akira Harata, et al., Appl. Phys. Lett., American Institute of Phytsics, vol. 57, No. 2, "Laser–Induced Surface Acoustic Waves and Photothermal Surface Gratings Generated by Crossing Two Pulsed Laser Beams", Jul. 9, 1990.
J. E. Sipe, et al., The American Physical Society, Physical Review B, vol. 27, No. 2, "Laser–Induced Periodic Surface Structure. I. Theory", Jan. 15, 1983.
Jeff F. Young, et al., The American Physical Society, Physical Review B, vol. 27, No. 2, "Laser–Induced Periodic Surface Structure. II. Experiments on Ge, Si, Al, and Brass", Jan. 15, 1983.
Jeff F. Young, et al., The American Physical Society, Physical Review B, vol. 30, No. 4, "Laser–Induced Periodic Surface Structure. III. Fluence Regimes, The Role of Feedback, and Details of the Induced Topography in Germanium", Aug. 15, 1984.

*Primary Examiner*—Charles Bowers
*Assistant Examiner*—Martin Sulsky
*Attorney, Agent, or Firm*—Oblon, Spivak McClelland, Maier & Neustadt, P.C.

[57] ABSTRACT

There is disclosed a method for manufacturing a polycrystal semiconductor film comprising the steps of applying a high energy beam to a surface of a semiconductor film comprising an amorphous or a polycrystal semiconductor provided on a surface of a substrate to melt only the semiconductor film, and solidifying the film via a solid and liquid coexisting state to form a semiconductor film comprising a polycrystal semiconductor having a large grain diameter, by heating a liquid part using a difference in an electric resistance in the liquid and solid coexisting state to heat only the liquid part, and by extending the solidification time until the completion of solidifying of the molten liquid crystal film. Furthermore, as the base film of the semiconductor film, a material having a melting point of 1600° C. and a thermal conductivity of 0.01 cal/cm.s.° C. is used to suppress heat dissipation from the molten liquid of the semiconductor to the substrate so that time until the complete solidification can be prolonged. Furthermore, the beam is irradiated so as to form a standing wave at a predetermined position of the surface of the semiconductor film to generate the heat density distribution having the same cycle with the standing wave and to melt the semiconductor film with the result that a polycrystal semiconductor film comprising a uniform and a large crystal grains by controlling the distribution of the crystal nuclei at the interface between the base film and the substrate.

18 Claims, 17 Drawing Sheets

METHOD FOR MANUFACTURING POLYCRYSTAL SEMICONDUCTOR FILM

BACKGROUND OF THE INVENTION

1. Field of the Invention

The present invention relates to a method for manufacturing a polycrysal semiconductor film used in a liquid crystal display device and the like, and more particularly to a method for manufacturing a polycrystal semiconductor film having crystal grains with a large and even diameter.

2. Description of the Related Art

Thin film transistors (hereinafter referred to as TFT) are normally formed on a polycrystal semiconductor film formed on a substrate such as a quarz substrate, a glass substrate or the like.

Semiconductor characteristics such as mobility of the polycrystal semiconductor film and the like are improved with an increase in the size of crystal grains. Consequently, in the case that a quarz glass having an excellent heat-resistance property is used as a substrate, and in the case that the damage of the substrate does not hinder the usage thereof, for example, such as a solar battery, there is used a method in which the substrate of an amorphous Si-film (hereinafter referred to as a-Si film) is heated as it is so that the semiconductor film is molten followed by holding the film in a heated state for a long time to anneal and to carry out a polycrystallization.

However, when the film is used as a TFT device of the liquid crystal display device, the quarz is very expensive with the result that the cost of the TFT becomes high. Consequently, the TFT device is consequently formed on the cheap glass substrate.

Here, when a polycrystal Si is used for the TFT device of the liquid crystal display device, a long-time high temperature annealing is required (for example heating for 8 to 56 hours in the atmosphere of a high temperature nitrogen at 600° C. or more). However, in the case of the glass substrate, a deformation or a warp is generated.

Consequently, there is normally used a pulse laser irradiation method in which only the semiconductor film is heated and molten in a short time by applying an excimer pulse laser to the amorphous semiconductor film or the semiconductor film comprising a fine crystal polycrystal on the glass substrate with the result that a polycrystal film with a large grain size.

In other words, in the polycrystallization using an excimer laser, more than several 10 nanosecond pulses are irradiated to a surface of the semiconductor film such as the a-Si (amorphous Si) film which is deposited on the surface of the substrate to melt only the film and provide a solid state via a mixed state of a solid phase and a liquid phase thereby forming a polycrystal film.

However, as described above, the excimer laser annealing can melt only the semiconductor film such as the a-Si film or the polycrystal Si film by applying more than several 10 nano second laser pulse to the film surface. However, there arises a problem in that the heat dissipation to the substrate is very fast so that time up to the completion of solidification is short and the crystal grain cannot be grown to a large size. It is necessary to take as long time as possible up to the solidification to grow the crystal grains to an even and large diameter.

However, it is possible to prolong the time required for the solidification by prolonging the pulse length of the laser, and prolonging the heat input time with a multiple pulse using a plurality of lasers. For all that, a single pulse length can be prolonged only by several times, so that the time up to the completion of the solidification cannot be prolonged on a large scale. Furthermore, a multiple pulse method using a plurality of lasers is an effective method in principle, but controlling a plurality of unstable lasers at the same time was virtually impossible.

Furthermore, in a simple method, the solidification time can be prolonged to some extent by applying a laser in a state in which the substrate is heated to an extent which does not affect the glass (300 to 500° C.). However, in the method, a large effect cannot be provided unless the substrate is heated to a temperature approximate to the melting point of the semiconductor. It was impossible to prolong the solidification time to a large extent up at a temperature of 300 to 500° C. which is a heat resistant temperature in the usage of the glass substrate.

In this manner, the formation of the polycrystal semiconductor film using the conventional pulse laser has a problem in that the solidification time is extremely short until the end of the solidification and the crystal grains cannot be grown to a large size.

Another problem is that when the film is completely molten to the substrate or to the interface with the base film at the time of melting the semiconductor film such as a-Si film or the polycrystal Si film or the like with the excimer laser, crystal nuclei at the interface which constitute seeds of crystallization have disappeared and the molten liquid is supercooled at the time of cooling with the result that a large number of crystal nuclei are abruptly generated from the interface and from within the molten liquid and crystal grains with a large grain size are not generated, a polycrystal semiconductor film comprising a plurality of fine crystals is provided and semiconductor properties such as required mobility or the like are not obtained.

On the contrary when the melting of the semiconductor film is insufficient, a large number of crystal nuclei remain at an interface with the substrate or the base film so that a crystal growth proceeds with the residual crystal nuclei as seeds and fine crystal grains, which have a grain diameter d which is in an inverse proportion to the density (N) of the residual nuclei, are generated.

When a relation between the intensity of the laser beam and the residual nuclei is described, the density of the residual nuclei decreases with an increase in the intensity of the laser beam so that the size of the crystal increases until the intensity of the laser beam increases, the semiconductor film is completely molten and the residual nuclei completely disappear.

However, when the intensity of the laser beam attains a maximum limit, the residual nuclei disappear, and, the supercooling is generated in the process of cooling with the result that fine crystallization is generated.

Therefore, in order to generate large crystal grains in a uniform manner, the control of the density of the residual nuclei and the generation position of the nuclei are important. However, in the method for manufacturing the polycrystal semiconductor film by means of the conventional excimer laser annealing, a size of crystal grains which are generated largely change with a fine variation of the intensity of the laser beam in the vicinity of a maximum value so that the polycrystal semiconductor having a stable and uniform large crystal grains could not be supplied.

SUMMARY OF THE INVENTION

The present invention has been made to solve the aforementioned problems.

A first object of the invention is to provide a method for forming a polycrystal semiconductor film in which the solidification is completed from the molten state after the laser irradiation and the solidification time can be prolonged until polycrystallization so that a polycrystal semiconductor film is formed, which has even and large crystal grains in the manufacture of the polycrystal semiconductor film by pulse laser annealing.

A second object of the invention is to provide a method for manufacturing a polycrystal semiconductor film comprising even and large crystal grains having a size of several μm order by realizing a light intensity distribution with a period of several μm on the surface of the amorphous or a polycrystal semiconductor film in the manufacture of the polycrystal semiconductor film by the pulse laser to control the residual nuclei at the interface between the base film and the amorphous or polycrystal semiconductor film in a period of several μm.

The method for manufacturing the polycrystal semiconductor film according to a first aspect of the invention comprises the steps of irradiating a high energy pulse beam onto a surface of a semiconductor film comprising an amorphous or first polycrystal semiconductor formed on a substrate to melt only the semiconductor film, and solidifying and forming the semiconductor film comprising polycrystal with large crystal grains via a solid-liquid coexisting state, wherein only a liquid part generated by the melting of the semiconductor film is heated by using a difference in an electric resistance between a solid part and a liquid part in the solid-liquid coexisting state so as to prolong the solidification time can be prolonged until the completion of the solidification of the semiconductor film.

Furthermore, the method for manufacturing the polycrystal semiconductor film according to the first aspect of the invention is characterized in that the liquid part of the semiconductor film is heated by electromagnetic induction heating method or electric heating method.

Furthermore, the aforementioned electromagnetic induction heating method is characterized in that a high frequency current is supplied to an induction heating coil provided on the rear surface of the substrate so that an alternate current magnetic field is generated in the semiconductor film with electromagnetic induction.

An area of the alternate current magnetic field generated by the electromagnetic induction is wider than the high energy pulse beam irradiating area so that only the molten, liquified and low resistant part are heated with electromagnetic induction.

Furthermore, the heat generation speed by electromagnetic induction heating is lower than the heat dissipation speed to the substrate from the molten semiconductor film.

Furthermore, the method is characterized in that an electric field or a frequency is controlled for heating the semiconductor film with electromagnetic induction in synchronization with the high energy pulse beam irradiation, heating of the aforementioned electromagnetic induction heating is corrected in correspondence to increase of resistance of the semiconductor film by the change of the ratio of the solid and the liquid along the progress of the solidification, and a constant heating state is held.

In another method for manufacturing the polycrystal semiconductor film according to the first aspect of the invention, a voltage is applied to a conductor provided adjacent to the aforementioned semiconductor film and the molten low resistant liquid part is heated.

Furthermore, the above method for manufacturing the aforementioned polycrystal semiconductor film is characterized in that only the semiconductor film part is electrified and heated wherein the aforementioned electrified area for heating and the aforementioned high energy beam application area overlap.

Furthermore, the aforementioned method for manufacturing the polycrystal semiconductor film is characterized in that a voltage is controlled for electrifying and heating the semiconductor film in synchronization with a high energy beam which is irradiated to a surface of the amorphous or polycrystal semiconductor film, and a lowering of the heating efficiency due to the increase of resistance which is generated by the change of the ratio of the solid and the liquid along the progress of the solidification is corrected to provide a constant heating state.

The method for manufacturing the polycrystal semiconductor film according to the second aspect of the present invention comprises irradiating a high energy beam onto a surface of an amorphous or a first polycrystal semiconductor film to melt the aforementioned semiconductor film, and further solidifying the semiconductor film to form a polycrystal film, wherein a material having a melting point of 1600° C. or more and having a heat conduction rate of 0.01 cal/cm.s.° C. is used as a base film of the aforementioned amorphous or the first polycrystal semiconductor film so as to prolong the solidification time up to the completion of the solidification by suppressing the heat dissipation from the molten liquid to the substrate.

The method for manufacturing the polycrystal semiconductor film according to the third aspect of the invention comprises irradiating a high energy beam onto a predetermined position of a surface of an amorphous or a first polycrystal semiconductor film to melt the aforementioned semiconductor film, and solidifying the semiconductor film to form a polycrystal, wherein the beam is irradiated to the surface of the semiconductor film so as to form a standing wave, and a heat density distribution which has the same cycle as the standing wave is generated at the predetermined position to melt the semiconductor film.

The method for manufacturing the polycrystal semiconductor film according to the third aspect of the present invention is further characterized in that the standing wave is formed by irradiating at least two laser beams at an incident angle which allows the standing wave to be formed, or by irradiating at least one standing wave at a predetermined angle and in a polarized light state.

Furthermore, the method for manufacturing the polycrystal semiconductor film according to the third aspect of the invention is characterized in that the incident angle is set so that the cycle of the heat density distribution is set to 1 to 10 μm.

Next, the method for manufacturing the polycrystal semiconductor film according to the first aspect of the present invention will be explained.

The process for solidifying the semiconductor film to which the high energy pulse beam is irradiated will be schematically shown in FIGS. 1A, 1B and 1C.

FIG. 1A shows a relation between the laser output and an elapsed time, showing that the laser output rises abruptly. Incidentally, this pulse width is about more than 10 n sec.

FIG. 1B shows a change of the temperature of the semiconductor film with an elapsed of time by the application of the aforementioned pulse beam. Incidentally, the temperature of the semiconductor film rises by the irradiation of the pulse beam with the result that the temperature of the semiconductor film attains the melting point at time To, and the film is in a liquid state. At time Ts, the semiconductor film is a complete solid state via the state that the solid and the liquid coexist between To and Ts. The solidification time according to the present invention is Ts−To.

FIG. 1C schematically shows a relation between the heat dissipation and the elapsed time.

In other words, the heat dissipation speed D by heat dissipation increases immediately after the start of the beam irradiation, and the heat dissipation speed D attains the peak by the melting of the film (To). The heat dissipation speed D is maintained with the result that a constant heat dissipation speed is maintained until the latent heat amount M of the solid state film becomes equal to the total amount of heat dissipation by passing through the solid and liquid coexisting state (D.T=M, but T refers to a time until the completion of the solidification), and the heat dissipation speed decreases again at the time of the completion of the solidification.

The change in an electrical resistivity of the silicon semiconductor film by the change of the solid and liquid state is shown in FIG. 2. The axis of abscissa shows a silicon temperature while the axis of ordinates shows a resistivity of the silicon. The silicon changes from the solid to the liquid in the vicinity of 1420° C. and the resistivity lowers from $5 \times 10^{-2}$ Ω·cm to $1 \times 10^{-4}$ Ω·cm.

Furthermore, FIG. 3 shows a relation between the impurity concentration in the silicon and the resistivity thereof. With the solid under room temperatures, the resistivity of an n-type silicon having an impurity concentration of $10^{16} cm^{-3}$ is about 1 Ω·cm. In other words, it has been made clear that the ratio of resistivity of the silicon molten part to that of the silicon solid of a high energy beam non-irradiation part (to room temperature) is about $1 \times 10^{31\ 4}$ Ω·cm: 1 Ω·cm, that is, $\frac{1}{10000}$.

By the way, the heat amount which is generated per unit time in the resistor (R (Ω)) to which rated voltage (E(V)) is applied is set to $Q = I \times E = E^2/R$ (I(Amp) denotes a current which flows through the resistor). Consequently, when the rated voltage is applied to the semiconductor film of the liquid and the solid, it has been made clear that the ratio r of the heat amount which is generated is set to r=s when the ratio of the resistance value of the semiconductor of the liquid and the solid is denoted by s (liquid/solid). In the case of the silicon, since the electric resistance is lower by approximately four digits in the liquid at the melting point as compared with the resistance value of the solid at room temperature, the heat amount of the liquid is 10000 times as large as the heat amount of the solid.

In other words, in the case where the semiconductor film is placed in an appropriate electric field, and a high energy pulse beam is irradiated thereto, only the semiconductor film which is molten with the beam irradiation is effectively heated as compared with the solid part.

Since the heat amount which is generated in proportional to the second power of that of the electric field E, it is possible to control the generated heat amount of the liquid and the solid by selecting an appropriate electric field. Consequently, the silicon in the liquid state can be gradually solidified by setting the heat amount which is generated in the molten liquid to a level slightly smaller than the heat dissipation amount. Thus, the solidification, that is, the time until the silicon is completely solidified can be prolonged with the extended duration of the molten state.

Next, the solidification time T' until the completion of the solidification, which is prolonged by the application of the electric field will be calculated with respect to (1) the case of a rated electric field and (2) the case of the constant heat generation.

(1) In the Case of Constant Electric Field

With respect to the case of the constant electric field, the heat generation of the semiconductor film in the solidification process and the change in temperature is shown in FIG. 4.

The electric resistance of the molten liquid and the electric resistance of the solid of the semiconductor film are denoted by R1 and R2 respectively, the heat dissipation speed is denoted by D, and the time until solidification is denoted by T'. For the time of the start of solidifying, it is required that heating speed ($E^2/R1$) is smaller than heat dissipation speed D. Consequently, the upper limit of the intensity of the electric field for heating is set to $E^2 < (DR1)$. Since the resistance of the semiconductor film rises (R1→R2) corresponding to the formula $\{(R2-R1)X+R1\}$ [x: solidification rate (0<x<1)], and the heating amount Q abruptly lowers depending on an increase of the solidification rate, the upper limit of time T' until the completion of the solidification, which satisfies the formula M=DT'-Q is two times the solidification time T in the case of the absence of the aforementioned heating means. In other words, in the application of the constant electric field, the time until the completion of solidification can be prolonged two times at most.

It can be seen that since the cooling speed of the semiconductor film in this case is determined by the formula $[D - E^2/\{(R2-R1)X+R1\}]$, the cooling speed increases along with the progress of the solidification.

(2) In the Case of Constant Heat Generation by the Control of the Electric Field.

The case in which the intensity of the applied electric field is controlled so that a constant heat is generated within the solidification time will be explained by using FIGS. 5A, 5B and 5C. Providing that heat dissipation speed at the melting point is constant, the cooling speed of the semiconductor film during the solidification is always constant in the case of constant heat generation. Realizing the condition of the constant heat generation, the change of the intensity of the electric field with the passage of time, time t from the irradiation of the laser beam, and the latent heat amount M of the semiconductor film are calculated from the relation equation of $E^2 = (D-M/T')\{(R2-R1)X+R1\}$. The relation between the electric field, the heat dissipation and generation speeds and the change in temperature is shown in FIGS. 5A, 5B and 5C. In other words, when the intensity of the electric field is controlled in the quadratic function in synchronization with the irradiation of the laser beam, an arbitrary solidification time can be obtained, and an arbitrary cooling speed can be obtained.

As a method for generating the electric field in the semiconductor film, an electric heating method or the electromagnetic induction method are available. In the former case, an electric area must be formed inside of the irradiated portion of the high energy beam. In the latter case, only the specimen is placed in the high frequency electric field. Furthermore, since the glass substrate is an insulator and the magnetic permeability is high, the irradiation of the laser beam is not hindered by providing an induction coil on a rear surface where the semiconductor film is not attached.

Furthermore, in both cases, it is possible to arbitrarily set the solidification time and the cooling speed by changing the intensity of the electric field in synchronization with the high energy pulse beam to control the heat amount which is generated within the molten liquid.

Next, a method for manufacturing the polycrystal semiconductor film according to the second aspect of the present invention will be explained.

In the method for manufacturing the polycrystal semiconductor film comprising irradiating a high energy beam onto the surface of the semiconductor film comprising amorphous or first polycrystal material, melting the aforementioned semiconductor film, and further solidifying the film to form the polycrystal film, there can be considered a method of suppressing the heat dissipation on the side of heat dissipation with respect to the method of suppressing the input side of heat.

Generally, as a base film (an undercoat film) of the silicon semiconductor film, $SiO_2$ film and SiN film are used from the viewpoint of heat resistance property and an impurity barrier. The heat resistance property of both films is sufficient for Si melting, but the thermal conductivity is 0.01 cal/cm.S,.° C. or more at a temperature of 1000° C. or more, hence the heat dissipation to the substrate cannot be sufficiently suppressed to a relatively high level.

As a result of an intensive study, the inventors of the present invention has found that a heat flow speed can be set to ½ to ⅓ by decreasing the thermal conductivity to ½ to ⅓ of the above-mentioned ceramic material, and the solidification time can be prolonged to two to three times.

The film which can be applied as the base film was investigated from the viewpoint of the heat resistance property and the thermal conductive property. It was found that $ZrO_2$, $TiO_2$, $Y_2O_3$, $HfO_2$, $MgO$, $Ta_2O_3$, $Nd_2O_3$ or the like can be used. As a result of considering an inappropriate properties such as moisture absorption and the lack of transparence as an LCD panel, it was found that $ZrO_2$, $TiO_2$, $Y2O_3$, and $HfO_2$ are an appropriate base film.

In the case where these materials are used as a base film of the semiconductor film, the heat dissipation from the part, which is molten by the irradiation of the high energy beam, to the substrate can be suppressed. The molten state after the irradiation of the laser beam can be maintained for a long time, the solidification time up to the solidification and the polycrystallization is prolonged with the result that a polycrystal semiconductor film having large crystal grains can be manufactured.

Next, the method for manufacturing the polycrystal film according to the third aspect of the present invention will be further explained.

The method for manufacturing the polycrystal semiconductor film according to the third aspect of the present invention comprising the steps of irradiating a high energy beam onto a predetermined position of a surface of an amorphous or a first polycrystal semiconductor film to melt the aforementioned semiconductor film, and solidifying the semiconductor film to form a polycrystal thereby forming a polycrystal film comprising polycrystal grains having a uniform and large diameter is characterized in that the high energy beam is irradiated to the surface of the semiconductor film so as to form a standing wave, and a heat density distribution which has the same cycle as the aforementioned standing wave is generated at the predetermined position to melt the semiconductor film.

As described above, in order to generate large crystal grains in the polycrystal semiconductor film, the control of the density of residual nuclei and the generation position of nuclei is important. However, in the method for manufacturing the polycrystal semiconductor film by means of the conventional excimer laser annealing, the size of the crystal grains which are generated largely changes with a minute change in the intensity of the laser beams in the vicinity of the limit value of the intensity of the laser beams with the result that a polycrystal semiconductor film having an uniform crystal grains cannot be obtained in a stable manner.

In order to solve the aforementioned problem, the following methods have been considered; (1) the method of forming crystal nuclei in advance at the interface between the base film and the semiconductor film, (2) the method of stabilizing the crystal grains at the interface by rendering non uniformity to the interface configuration and the material quality of the base film, (3) the method of promoting the generation of crystal nuclei by adding different kinds of elements or compounds to the interface with the base film, and (4) the method of forming an intensity distribution in the laser beam to form residual nuclei in the low intensity part. Among the aforementioned methods, a further intensive study has been made on the method (4) which is regarded as the most excellent in terms of an inferior influence to the property of the TFT element and cost thereof.

As the method (4) for forming an intensity distribution of the laser beam, several methods were considered. In other words, the following methods were considered; (a) the method of severing part of the beam, (b) the method of overlapping the positions of the plurality of beams by slightly shifting the positions thereof, and (c) the method of interference by means of diffraction element such as slit or the like. All these methods were insufficient as a method for controlling the crystal nuclei.

Time (solidification time) up to the cooling and solidifying of the semiconductor film which is molten with the pulse laser of more than 10 n sec such as an excimer laser which is used with respect to the polycrysal semiconductor film is extremely short (about 100 n sec), and the maximum grain diameter which can be grown during this period is limited to only several $\mu$m. Therefore it is necessary to form the distribution of the residual grains to several $\mu$m or less.

Consequently, the cyclic property of the laser beam intensity distribution becomes thousand times or more (more than 10 $\mu$m) of the wavelength of light (more than 100 nm) so that the aforementioned condition cannot be satisfied. By a further intensive study, the inventors of the present invention have succeeded in realizing the light intensity distribution having a cycle of several $\mu$m by irradiating beam so as to form a standing wave on the surface of the amorphous or the first polycrystal film and in forming a polycrystal film comprising uniform and large crystal grains on the order of several $\mu$m by controlling the residual nuclei located at the interface with the base film in a cycle of several $\mu$m.

A first method for forming a standing wave in the method for manufacturing the polycrystal semiconductor film according to the third aspect of the invention, two laser beams are irradiated to the predetermined position of the surface of the amorphous or first polycrystal semiconductor film at an incident angle which allows the formation of the standing wave so that a heat density distribution having the same cycle as the standing wave is generated at the aforementioned predetermined position to melt the film.

In other words, by allowing two laser beams to be interfered with each other on the surface of the semiconductor film the standing wave is formed. Then the cycle of the standing wave can be represented by $\lambda/(2 \sin\theta)$ wherein $\lambda$ denotes a wavelength of the laser beam, and $\theta$ denotes an incident angle.

Consequently, it becomes possible to control the cycle of the heat density distribution which is formed on the semiconductor film or the cycle of the standing wave in a high precision by adjusting the incident angle.

Here, in the TFT-LCD polysilicon, it is desired that the grain diameter of the polysilicon is set to 1 to 10 $\mu$m. However, in order to form the polysilicon film having the grain diameter of this size, it is desired that the incident angle is 0.7 degrees or more and 8.2 degrees or less when the wavelength of the laser beam is set to 230 to 280 nm, the incident angle is set to 0.9 or more and 8.9 or less degrees when the wavelength of the laser beam is set to 280 to 400 nm, the wavelength thereof is set to 1.5 or more and 15 degrees or less when the laser beam is set to 400 to 800 nm, and the wavelength thereof is 2.9 or more to 30 degrees or less when the wavelength thereof is set to 800 to 1200 nm.

The second method for forming the standing wave in the method for manufacturing the polycrystal semiconductor film according to the third aspect of the invention comprises applying at least one laser beam to a predetermined position of the surface of the amorphous and polycrystal semiconductor at a predetermined incident angle and in a polarization state to form a standing wave, and generating a heat density distribution in the same cycle as the standing wave to melt the semiconductor film.

In this method, the standing wave is formed on the surface of the aforementioned semiconductor film by irradiating again a second laser beam on to a rough surface roughness, the rough surface being formed after the semiconductor film is once molten and recrystallized with a first irradiation of the laser beam, wherein scattering beams generated on the rough surface are interfered with each other.

Here, it is at least required that the polarization state of the laser beam forms an angle other than 45 degrees with respect to the reflection surface, and it is further desired that the polarization state stand in a parallel state (P polarization) or a vertical state (S polarization). Then either a parallel state or a vertical state is provided, with respect to the cycle of the standing wave the standing wave having a cycle of λ/(1−sinθ) and λ/(1+sinθ) is generated in a direction vertical to the polarization direction, and a standing wave having a cycle of λ/cosθ is generated in a direction parallel to the polarization direction.

In particular, the standing wave having a cycle of λ/(1 sin+sinθ) is strong in the condition approximate to the vertical direction of 35 degrees or less. On the other hand, the standing wave a cycle of λ/cosθ is allowed to be incident in a slanting manner at an angle of 35 degrees or more, and the standing wave is strong in the polarization state parallel to the reflection surface, that is, the P polarization.

Consequently, it becomes possible to control the cycle of the standing wave, or the cycle of the heat density distribution which is formed on the surface of the semiconductor film.

Incidentally, in this case, in order to form the polysilicon film having a diameter of 1 to 10 μm, the incident angle is set to 76 degrees or more and 88.6 degrees or less when the wavelength of the laser beam is 230 to 280 nm, it is desired that the incident angle is set to 72 degrees or more and 88.2 degrees or less when the wavelength of the laser beam is 280 to 400 nm, it is desired that the incident angle is set to 59 degrees or more and 87.1 degree or less when the wavelength of the laser beam is 400 to 800 nm, and the incident angle is set to 0 degree or more and 84.3 degrees or less when the wavelength of the laser beam is set to 800 to 1200 nm.

The summary of the invention has been described with respect to the method of manufacturing the polycrystal semiconductor film according to the first, second and third aspect of the invention, the advantage of the invention can be further heightened by combining these methods.

In other words, in the methods according to the first and the second aspect of the invention, the time of solidification the semiconductor film can be prolonged by irradiating the high energy pulse laser. In other words, the method contributes to the prolongation of the solidification time.

Furthermore, in the method for manufacturing the semiconductor film according to the third aspect of the invention, the uniformity in the size of the crystal grains can be remarkably improved by controlling the interface crystal nuclei using the interference of the laser beams.

Embodiments of the invention will be described in detail hereinbelow.

BRIEF DESCRIPTION OF THE DRAWINGS

FIG. 1A shows a relation between a laser output and time. FIG. 1B shows a relation between the semiconductor film temperature and time. FIG. 1C shows a relation between heat dissipation speed and time.

FIG. 4A shows a relation between the voltage and the time. FIG. 4B shows a relation between heat dissipation speed, heating speed and time. FIG. 4C shows a relation between the semiconductor film temperature and time.

FIG. 5A shows a relation between the voltage and time. FIG. 5B shows a relation between heat dissipation speed and heating speed. FIG. 5C shows a relation between the semiconductor film temperature and time.

FIG. 6A is a perspective view, and FIG. 6B is a sectional view.

FIG. 7A is a perspective view, and FIG. 7B is a sectional view.

FIG. 15A is a front view and FIG. 15B is a plan view.

PREFERRED EMBODIMENT OF THE INVENTION

Forms for embodying the present invention will be explained hereinbelow.
Embodiment 1

In the beginning, an embodiment of a method for manufacturing the polycrystal semiconductor film according to a first aspect of the invention will be described.

Figure 1A:
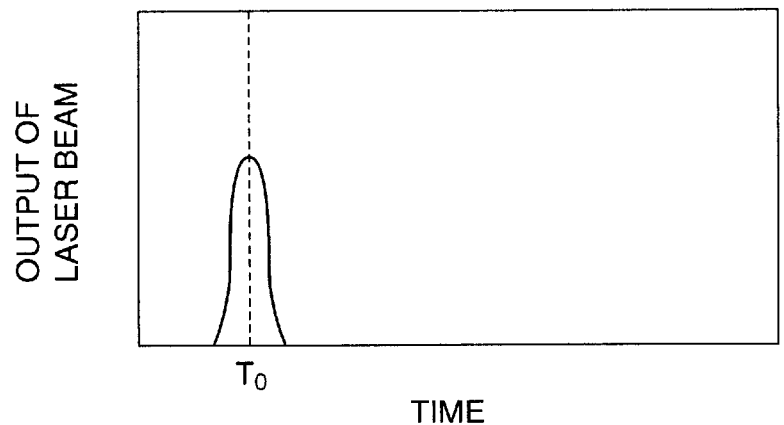
FIG. 1A, FIG. 1B and FIG. 1C are views for generally explaining a process of melting and solidifying the semiconductor film by a laser under a non-electric field.
Figure 1B:
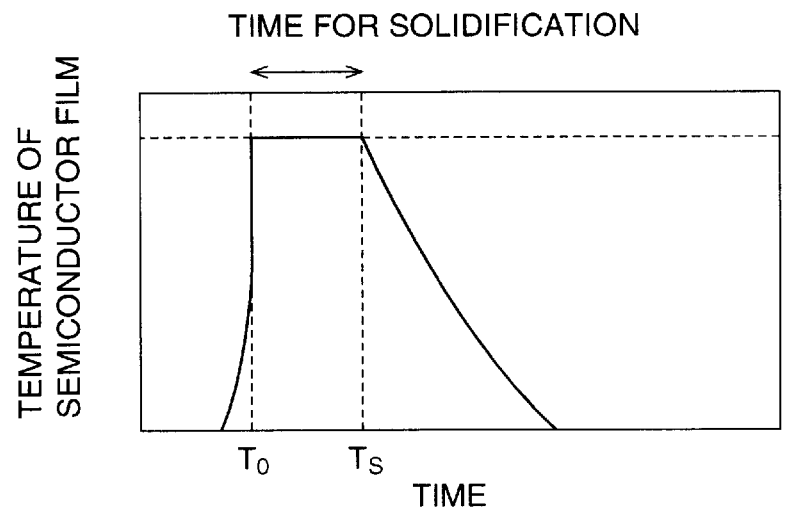
Figure 1C:
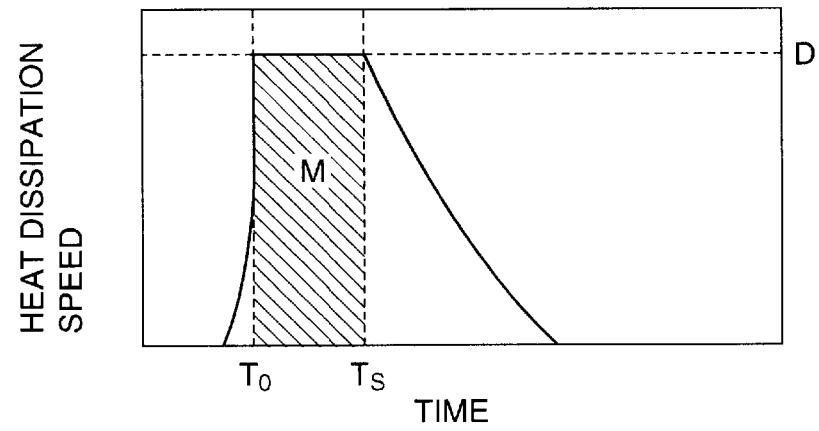
Figure 2:
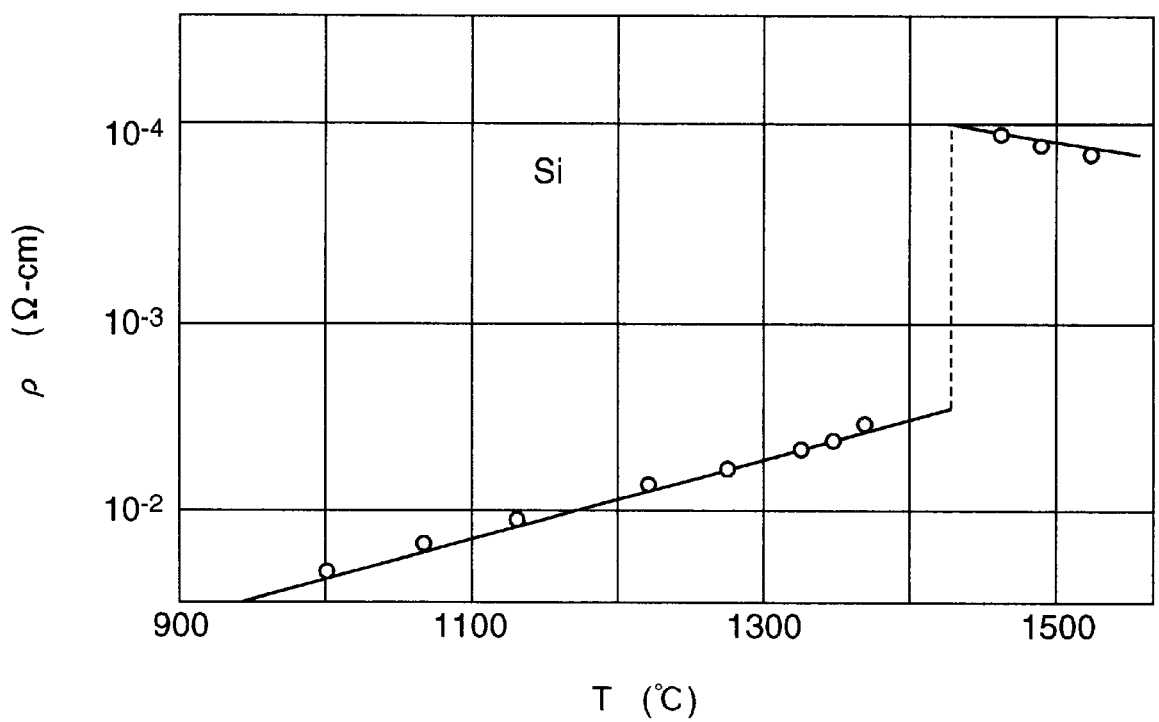
FIG. 2 is a view showing a temperature change of an electric resistivity of Si which is a semiconductor film material.
Figure 3:
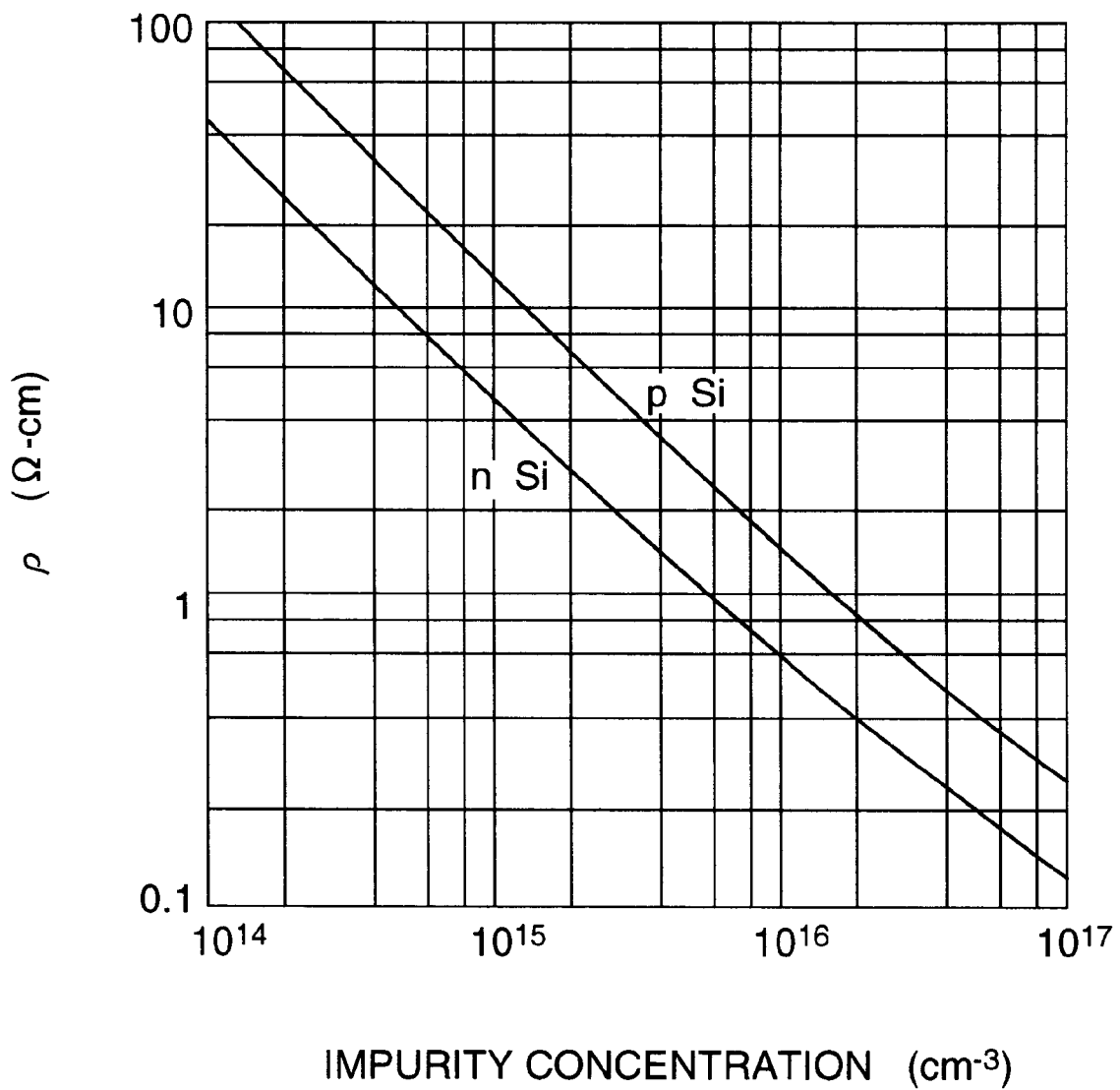
FIG. 3 is a view showing a relation between an impurity concentration in Si and the electric resistivity (room temperature).
Figure 4A:
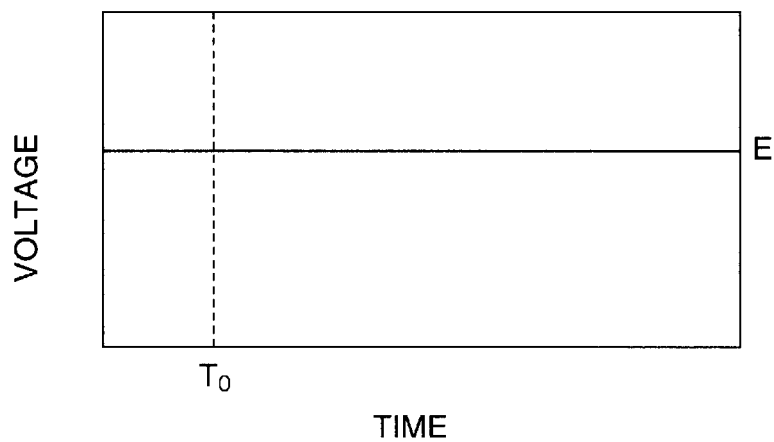
FIG. 4A, FIG. 4B and FIG. 4C are views for generally explaining a process of melting and solidifying the semiconductor film by a laser under a constant electric field.
Figure 4B:
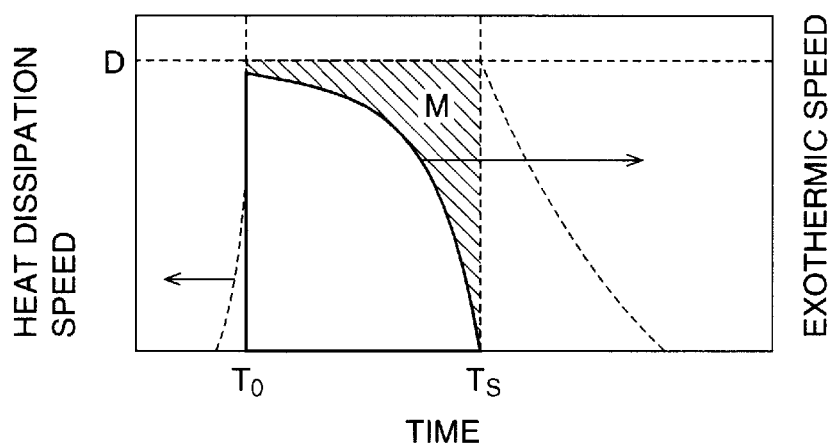
Figure 4C:
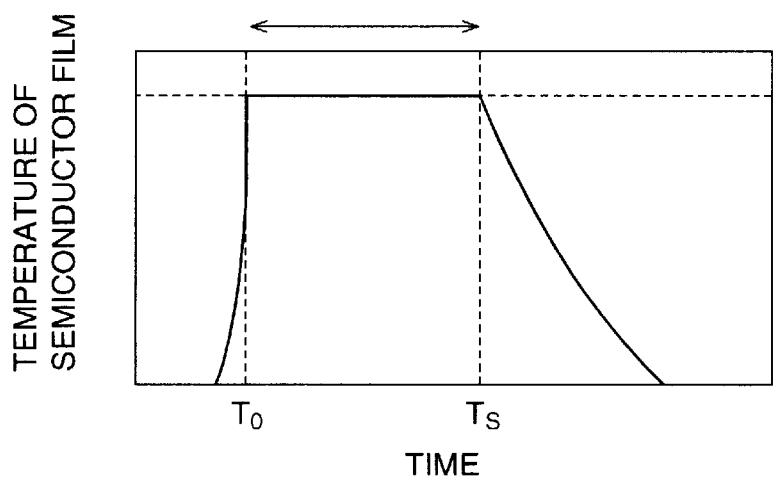
Figure 5A:
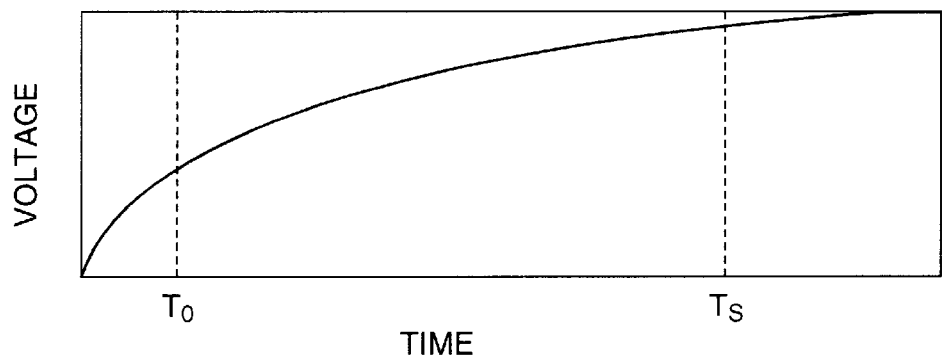
FIG. 5A, FIG. 5B, and FIG. 5C are views for generally explaining a process of melting and solidifying the semiconductor film by a laser under a control of the electric field (constant heat generation).
Figure 5B:
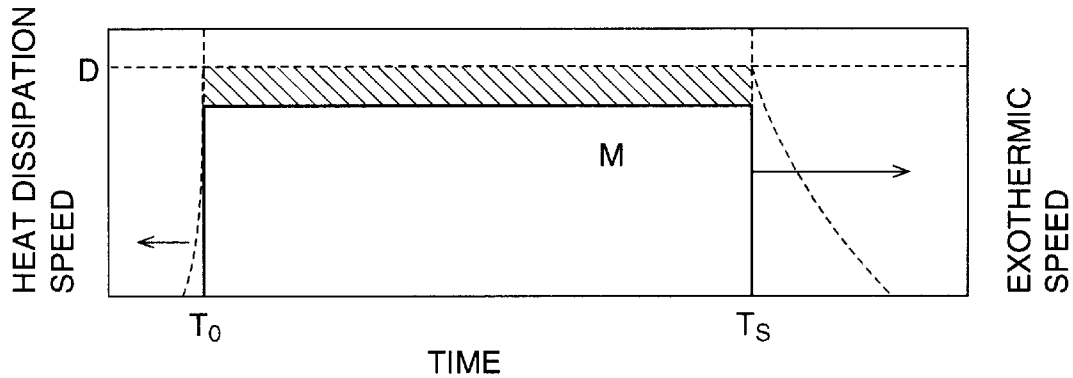
Figure 5C:
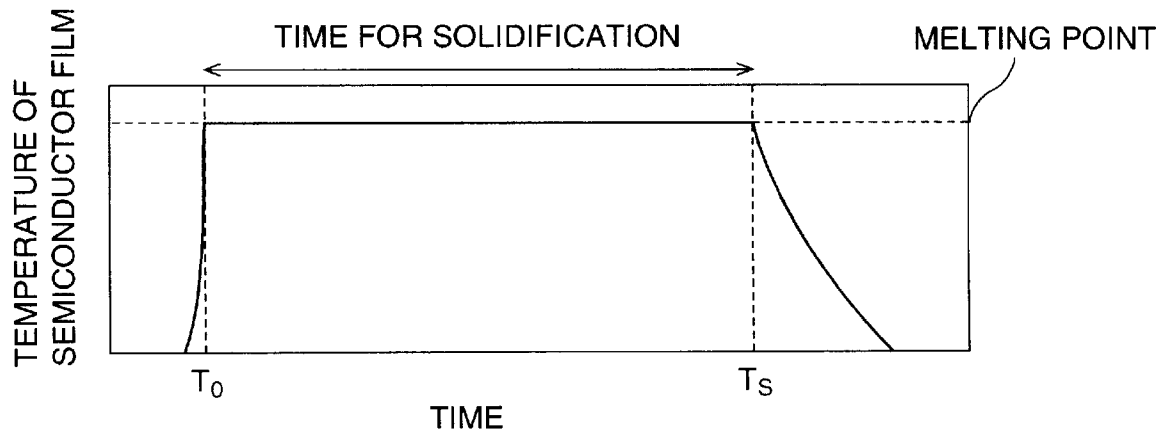
Figure 6A:
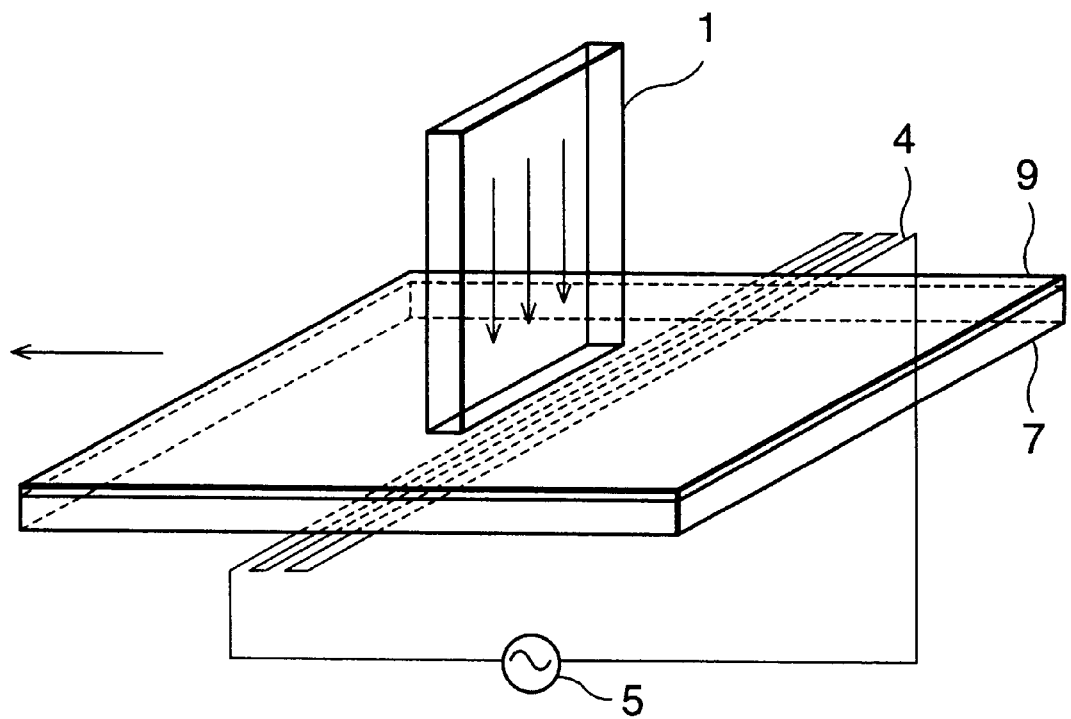
FIG. 6A and FIG. 6B are views showing an arrangement of a laser application device and an induction heating device for explaining a method for manufacturing a polycrystal semiconductor film according to a first aspect of the present invention.
Figure 6B:
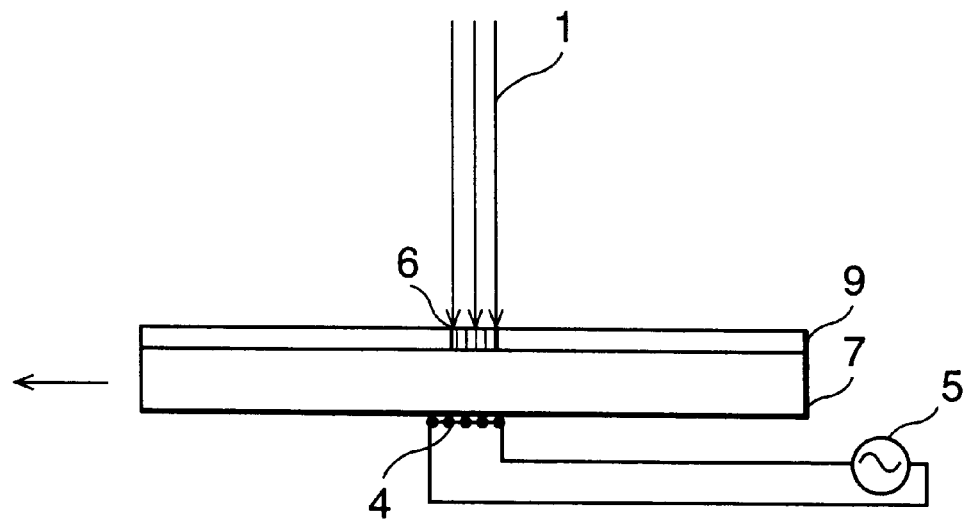

FIG. 6 is a schematic view showing an arrangement of a laser application device and an electromagnetic induction heating device for embodying the method for manufacturing the polycrystal semiconductor film according to a first aspect of the invention. A high energy beam 1 (an excimer pulse laser is used in this embodiment) from a single light source is vertically applied to a semiconductor film 9 on a glass substrate 7. An induction heating coil 4 is arranged on a rear surface of the glass substrate of the high energy beam application part. A high frequency current flows through a coil from a high frequency electric source 5 with the result that the substrate itself moves in synchronization with a high energy pulse beam so that a high energy beam can be irradiated to the substrate itself and the substrate can be induction heated.

A resistance value of the a melting part 6 of the semiconductor film, which is generated by the irradiation of the high energy beam, is lowered so that an eddy current flows through the semiconductor film with an alternate current field, which is generated in the semiconductor film, and only the melting part is induction heated with the result that the solidification time is prolonged.

It is required that a heat generation speed from the induction heating does not raise the temperature of the melting part, that is the heat generation speed is smaller than the heat dissipation speed for gradually solidifying the silicon in the liquid state. It is required that the high frequency electric field and a high frequency is set so that the heating amount at this time does not exceed the heat dissipation speed because the resistance value becomes lowest in the state in which the application part is completely molten.

The solidification time can be prolonged by two times at most by the high frequency induction heating of the constant output of such constant voltage with the result that the grain diameter of the crystal grains which can be grown within this solidification time can be enlarged by approximately two times and the TFT element properties such as mobility can be improved.

Furthermore, the voltage and the frequency of the high frequency induction are controlled in synchronization with the irradiation of the high energy beam, and the lowering of the heating efficiency is compensated with an increase in the resistance value accompanying with the progress of solidification of the semiconductor film and the constant heated state can be kept during the solidification time with the result that an arbitrary solidification time can be selected and more larger crystal grains can be grown.

Incidentally, the high frequency zone which can be used in the present invention can be used during the scope of 1 KHz to 1 GHz. In the case of the control of the electric field, it is desirable that a frequency zone of 100 MHz or more (one cycle: 10 n sec) can be used wherein a response is possible which is sufficiently fast as compared with the solidification time of about 100 n sec.

Furthermore, a micro-wave of 1 GHz or more is applied to a high energy beam by using a wave guide path, an advantage similar to the induction heating (micro-wave heating) can be obtained.
Embodiment 2

Another embodiment of the method for manufacturing the polycrystal semiconductor film according to the first aspect of the present invention will be described hereinbelow.

Figure 7A:
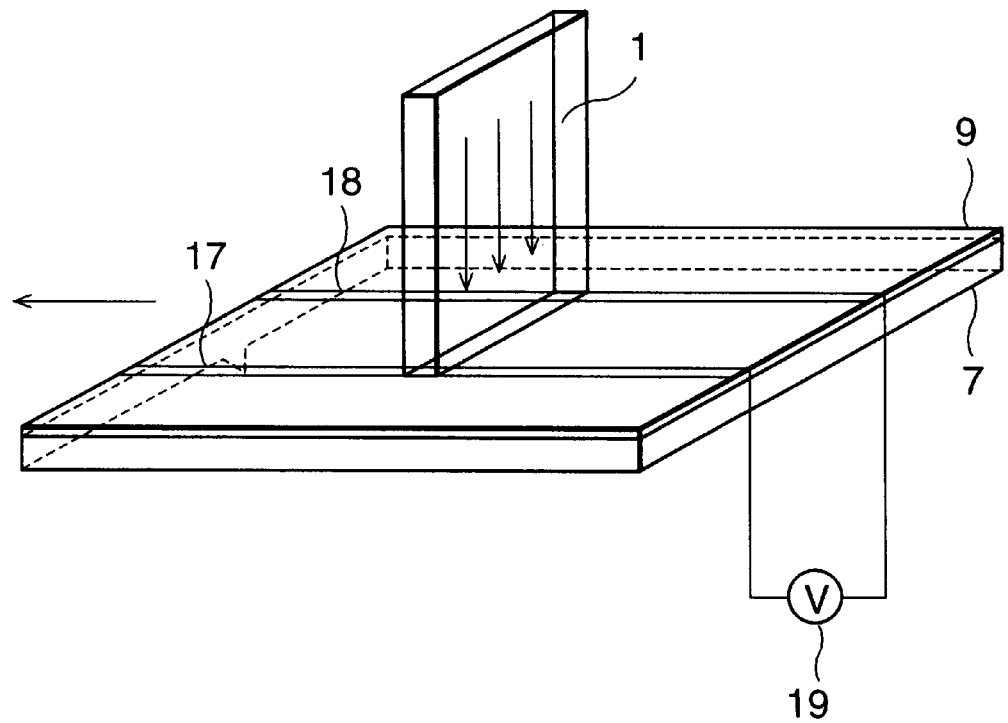
FIG. 7A and FIG. 7B are views showing an arrangement of the other laser application device and an electric heating device for explaining the polycrystal semiconductor film according to the first aspect of the present invention.
Figure 7B:
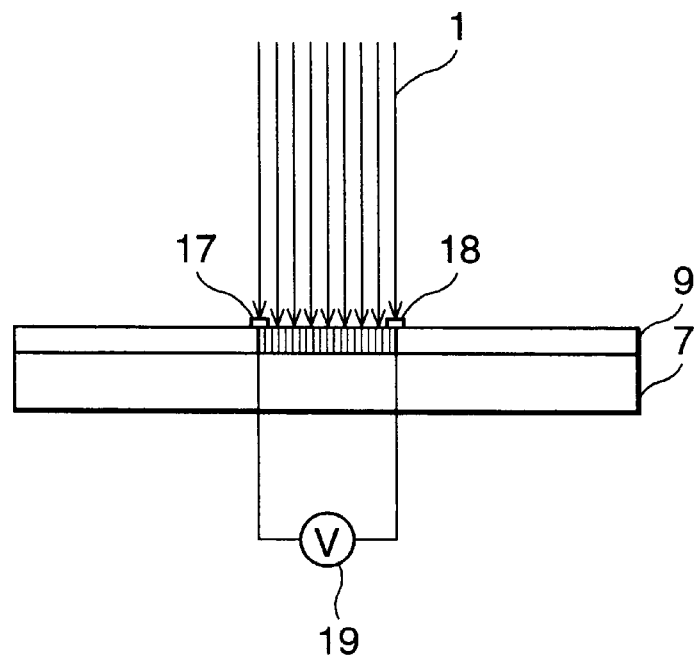

FIG. 7 is a schematic view showing an arrangement view of the laser application device and the electric heating mechanism for realizing the polycrystal semiconductor film according to the present invention. A high energy beam (an excimer pulse laser beam is used in the present invention) is irradiated to the semiconductor film 9 on the glass substrate 7 vertically from a single light source. On or beneath the semiconductor film located at both ends of the long side of the high energy beam irradiation part, metal wirings 17 and 18 such as Al and the like is formed in such a manner that the metal wirings cross the substrate, and a voltage is applied to the wirings from the power source 19.

By irradiating a high energy beam to the semiconductor film between electrodes including the electrodes, the semiconductor film is molten and the resistance value of the semiconductor film is lowered so that current flows through the molten part 6 of the semiconductor film and the molten semiconductor film itself is resistance-heated.

Since this heat amount is proportional to the second power the voltage which is applied, the voltage can be controlled. In the case of the constant voltage, it is required that the heating speed is smaller than the heat dissipation speed under the melting point. In other words, it is required that the voltage is set in accordance with $D > (E^2/R_L)$. Furthermore, it is possible to prolong the solidification time to an arbitrary length by controlling the voltage in synchronization with the high energy pulse beam to compensate the lowering of the heating amount caused by the rise in the resistance value accompanying with the progress of the solidification of the semiconductor film.

As described above, in accordance with the present invention, there is an advantage in that in the process of manufacturing the polycrystal semiconductor film by melting and crystallizing the semiconductor film, the solidification time can be arbitrarily prolonged irrespective of the length of the pulse of the pulse laser with the result that the polycrystal with a large grain diameter can be stably manufactured, and the crystal property of the polycrystal semiconductor film and the TFT property can be improved.

Embodiment 3

In embodiment 3, the method for manufacturing the polycrystal semiconductor film according to the second aspect of the present invention will be explained by referring to FIG. 8.

Figure 8:
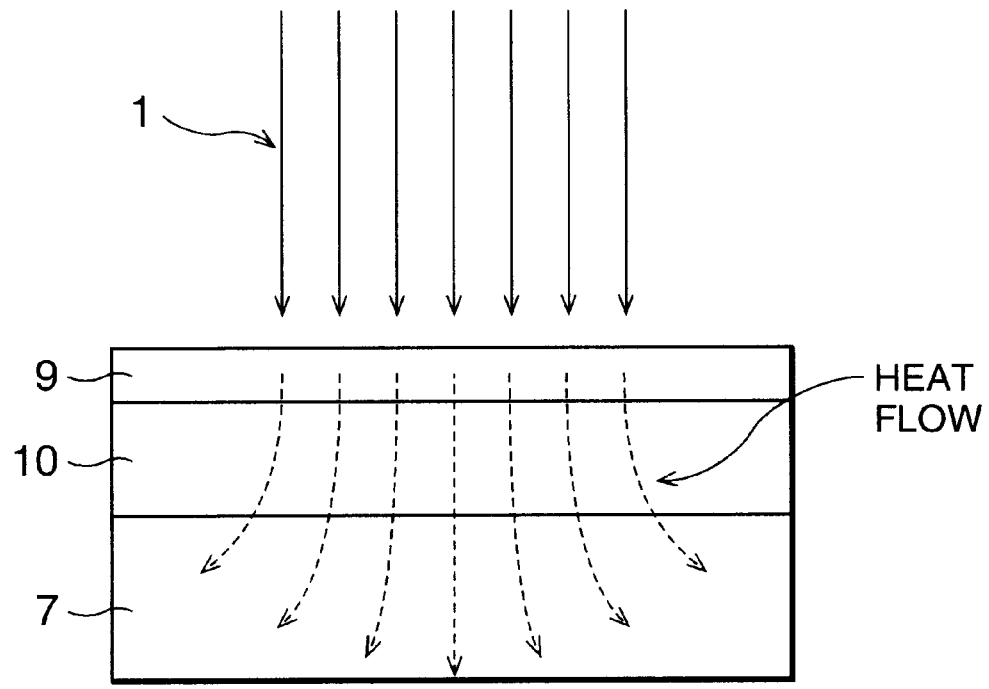
FIG. 8 is a sectional view for explaining a heat stream by heat radiation immediately after heating by laser beam irradiation the base film and the semiconductor film which are formed on the substrate in the method for manufacturing the polycrystal semiconductor film.
Figure 9:
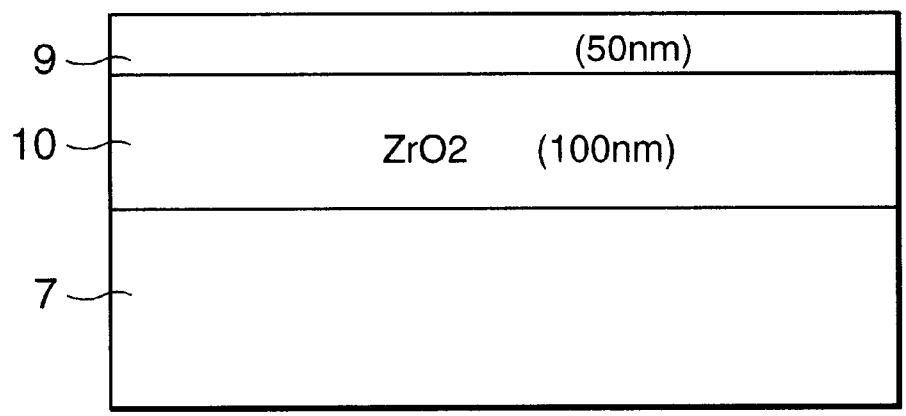
FIG. 9 is a view illustrating a cross section structure of the substrate in which $ZrO_2$ film is used as a base film in the method for manufacturing the polycrystal semiconductor film according to the second aspect of the present invention.

In the polycrystal Si film formation specimen comprising three layer structure of the semiconductor film 9 the base film 10 and the glass substrate 7 shown in FIG. 8, a $ZrO_2$ sputtering film is used as the base film. Furthermore, for comparison, a specimen in prepared in which the conventional $SiO_2$ film is used as the base film. The apparatus shown in FIG. 6 is used except for the electromagnetic induction heating device. After the XeCL excimer laser is irradiated 10 times at the optimal fluence of 300 $mJ/cm^2$, the average grain diameter of the polycrystal silicon film and the minimum grain diameter were compared. The result is shown in Table 1.

TABLE 1

Grain Diameter of the Polycrystal Silicon Film

| Kind of Base Film | Average Grain Diameter of Polycrystal Silicon Film | Minimum Grain Diameter |
|---|---|---|
| $SiO_2$ | 500 nm | 50 nm |
| $ZrO_2$ | 1000 nm | 65 nm |

As shown in Table 1, in the case where the same condition laser is applied, it has been recognized that the average grain diameter is enlarged to two times by using $ZrO_2$. In other words, it is judged that the solidification time is prolonged, thereby the grain diameter being enlarged.

As described above, in the process of manufacturing the polycrystal semiconductor film by melting and crystallizing the semiconductor film by the high energy pulse laser, time up to the solidification can be prolonged, and the polycrystal semiconductor film having a large grain diameter can be manufactured stably with the result that the crystal property and the TFT property of the polycrystal semiconductor film can be improved.

Embodiment 4

In the embodiment, the method for manufacturing the polycrystal semiconductor film according to the third aspect of the invention will be explained by referring to FIGS. 10A and 10B.

Figure 10A:
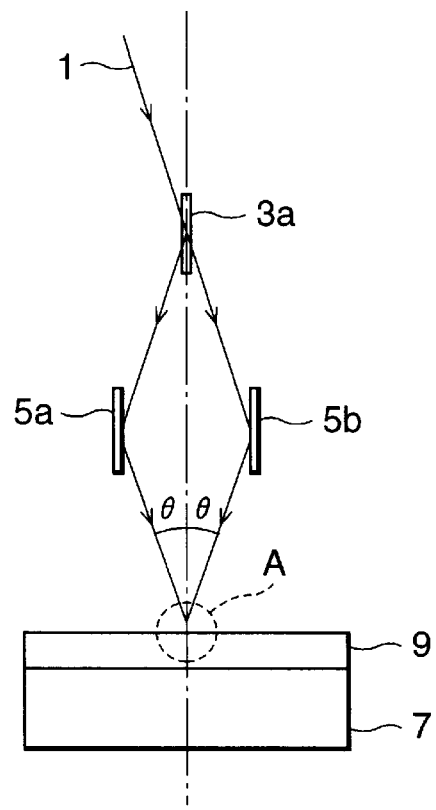
FIG. 10A is a view for explaining one example of a position relation (optical arrangement) of laser light and the semiconductor substrate.

FIG. 10A is a view showing a position relation between the laser beam and the semiconductor film. FIG. 10B is an enlarged view of an A part shown in FIG. 10A. In FIGS. 10A and 10B, reference numeral 7 denotes a glass substrate, and 9 an amorphous semiconductor film or a first polycrystal film. As shown in FIG. 10A, the laser beam 1 is split into two beams with a beam splitter 3a. Then the two split beams are allowed to be intersected and interfered so that a standing wave having the cycle of the wavelength order (on the order of $\mu$m) is formed on the surface of the semiconductor film 9.

Figure 10B:
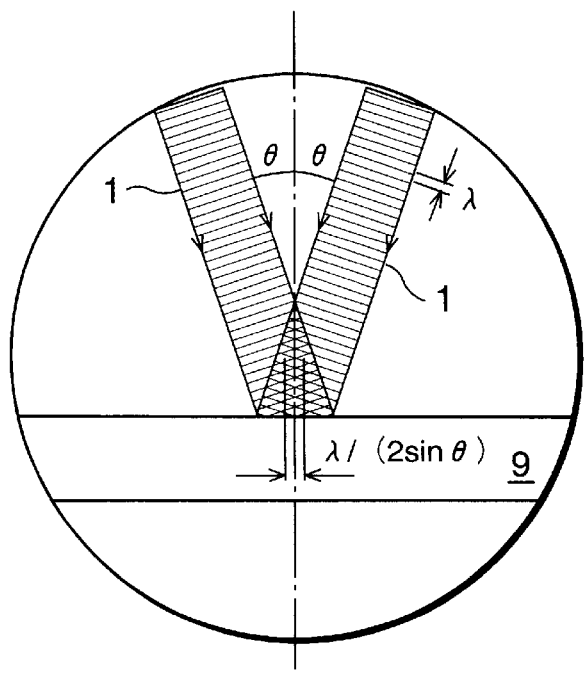
FIG. 10B is an enlarged view of an A part shown in FIG. 10A.

For example, in the case where the wavelength of the laser beam 1 is $\lambda$, as shown in FIG. 10B, the cycle of the standing wave formed on the surface of the semiconductor film 9 is set to $\lambda/(2 \sin\theta)$ (for example, refer to Appl. Phys. Lett. 57, 132, 1990). Then, with the intensity distribution, the heat generation density distribution having the same cycle with the aforementioned standing wave is formed on the surface of the semiconductor film 9. In a low part of the heat generation density distribution corresponding to the valley (knot part) of the standing wave, the residual nuclei can be controlled on the order of the wavelength (on the order of $\mu$m). As a consequence, a polycrystal semiconductor film which has uniform large crystal grains can be manufactured.

Figure 11:
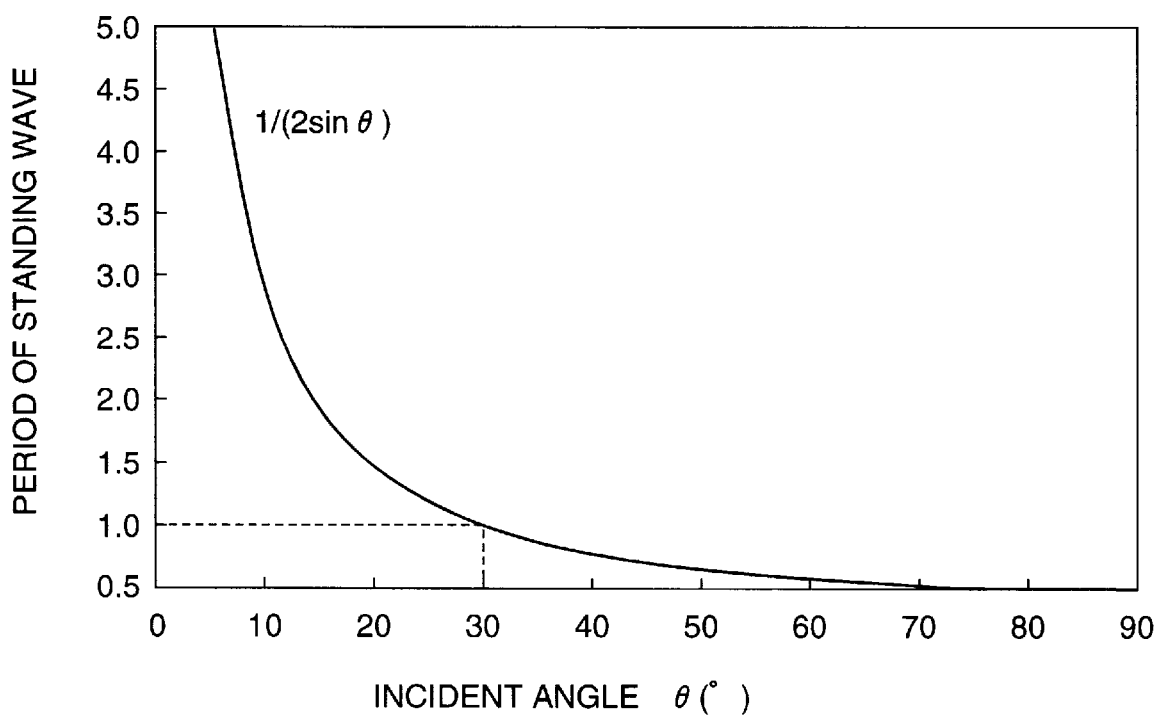
FIG. 11 is a view showing a relation between an incident angle formed between two laser beams and the semiconductor film and a cycle of a standing wave which is formed on the surface of the semiconductor film.

FIG. 11 is a view showing a relation between the incident angle $\theta$ with respect to two beams semiconductor film 9 shown in FIG. 10B and the cycle of the standing wave which is formed on the surface of the semiconductor film 9. It can be seen that when the incident angle $\theta$ is not more than 30 degrees, the standing wave having the cycle of the wavelength of $\lambda$ or more of the laser beam can be formed whereas when the incident angle $\theta$ is not less than 30 degrees the standing wave having the cycle of the wavelength of $\lambda$ or less can be formed.

In this manner, according to embodiment 4, the cycle of the standing wave can be controlled with the incident angle $\theta$. Consequently, the incident angle $\theta$ may be set to the scope of 5 to 20 degrees as shown in FIG. 11 in order to set the cycle of the interference fringe pattern to about several times of the wavelength $\lambda$ of the laser beam 1.

For example, in the polysilicon for TFT (thin film transistor)—LCD (liquid crystal display), it is desired that the grain diameter is set to 1 to 10 $\mu$m. In order to manufacture the polysilicon having this diameter in the method for manufacturing the polycrystal semiconductor film, the relation between the wavelength $\lambda$ of the laser beam 1 and the incident angle $\theta$ is shown in Table 2.

TABLE 2

Relation between the Wavelength $\lambda$ of the laser beam 1 and Incident Angle $\theta$

| Wavelength $\lambda$ of the laser beam 1 | Incident Angle $\theta$ |
|---|---|
| KrF laser (248 nm) | $0.7° \leq \theta \leq 8.2°$ |
| XeCl laser (308 nm) | $0.9° \leq \theta \leq 8.9°$ |
| $Ar^+$ laser (514.5 nm) | $1.5° \leq \theta \leq 15°$ |
| YAG laser (1060 nm) | $2.9° \leq \theta \leq 30°$ |

Incidentally, in order that the heat generation density distribution which is generated on the surface of the semiconductor film 9 with the aforementioned standing wave forms residual nuclei, the heat generation density at the valley part (knot part) of the standing wave ($Q_{Bottom}$) must be 0 or more and not less than the heat amount $Q_1$ necessary for the complete melting of the semiconductor film 9. On the other hand, the heat generation density ($Q_{Top}$) at the peak part of the standing wave must be not less than $Q_L$ and not more than the heat density amount $Q_{AB}$ at which the semiconductor film 9 is ablated (the temperature of the semiconductor film exceeds the melting point by absorbing heat and is vaporized).

In other words, the following equation (1) must be satisfied so that the residual nuclei are stably formed on the valley part (knot part) of the standing wave.

$$0 \leq Q_{Bottom} \leq Q_L \leq Q_{Top} \leq Q_{AB} \qquad (1)$$

Here, when the average output $(Q_{Top}+Q_{Bottom})/2$ is set to $Q_L$, the following relation can be calculated from the aforementioned equation (1) providing that $\pm\delta$ represents the change rate of the laser beam output 1, $Q_{P-P}(=Q_{Top}-Q_{Bottom})$ denotes a difference between the heat generation density at the valley part and at the peak part.

$$Q_{P-P} \geq 2\delta Q_L \quad (2)$$

It can be seen from the equation (2) that a difference in the heat generation density distribution $Q_{P-P}$ of the standing wave, namely the amplitude must be set to not less than the change in the output of the laser beam.

However, as a factor which affects the existence of the residual nuclei, the change in the output of the aforementioned laser beam is a main factor. As other factors, the change in the thickness of the semiconductor film and the change in the thermal conductivity of the base film can be given. Consequently, the amplitude must be set to a level more than the total fluctuation.

Incidentally, in the embodiment, one laser beam is split, but the present invention is not limited thereto. As long as the wavelengths and the phases thereof agree with each other, two or more laser beams may be combined to be used.

Embodiments of the present invention will be further explained.

Embodiment 5

Embodiment 5 relates to the method for manufacturing the polycrystal semiconductor film according to the third aspect of the invention, but embodiment 5 has a different optical arrangement with embodiment 4.

Figure 12:
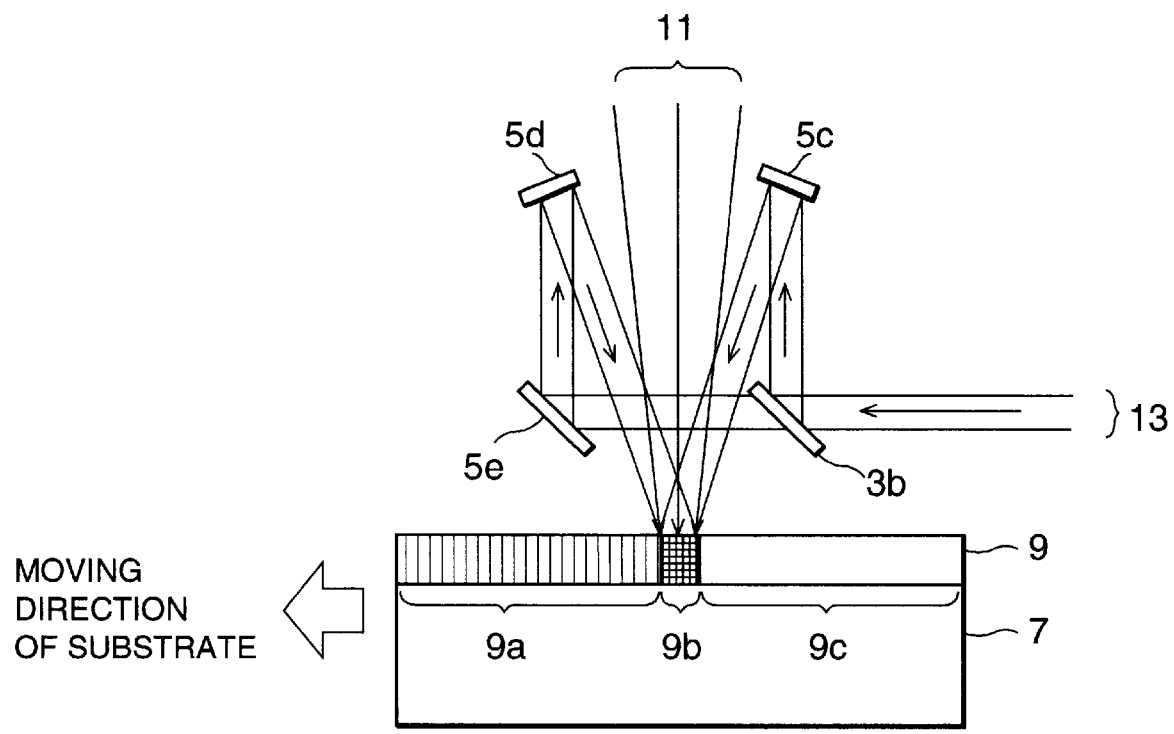
FIG. 12 is a front view showing a position relation (optical arrangement) between other laser light and the semiconductor substrate in the method for manufacturing the polycrystal semiconductor film according to a third aspect of the present invention.

FIG. 12 shows an optical arrangement which is different from embodiment 4.

In the apparatus according to embodiment 4, excimer laser beam 11 is vertically irradiated to the surface of the silicon film on the glass substrate 7. On the other hand, second laser beam 13 which has a longer wavelength ($\lambda$) than the excimer laser beam 11 is split into two beams by using a beam splitter 3b so that each of the beams is irradiated to an excimer laser application part of the silicon film 9 at an incident angle $\theta$ by using reflection mirrors 5c, 5d and 5e so as to allow the two beams to be interfered with each other and a standing wave is formed on the silicon film 9.

Then the heating by the excimer laser beam 11 and beam the heating by the standing wave which is formed by the second laser beam 13 forms a temperature distribution having a cycle of $\lambda/(2 \sin\theta)$.

At this time, when the output of the excimer laser beam 11 and the second laser beam 13 are set so that the low temperature part of this temperature distribution becomes not more than the melting point (1415° C.) and the high temperature part of the temperature distribution part becomes not less than the melting point of the silicon, the residual nuclei can be selectively formed only on the low temperature part of the standing wave.

Then by using the residual nuclei as a seed of the crystal grains after that, the crystal having a large grain diameter can be formed.

When the glass substrate as a whole is moved at a step less than the width of the laser beam at each time of laser beam application, the silicon film as a whole can be recrystallized.

Embodiment 6

Embodiment 6 relates to the method for manufacturing the polycrystal semiconductor film according to the third aspect of the invention, but embodiment 6 has a different optical arrangement with embodiments 4 and 5.

Figure 13:
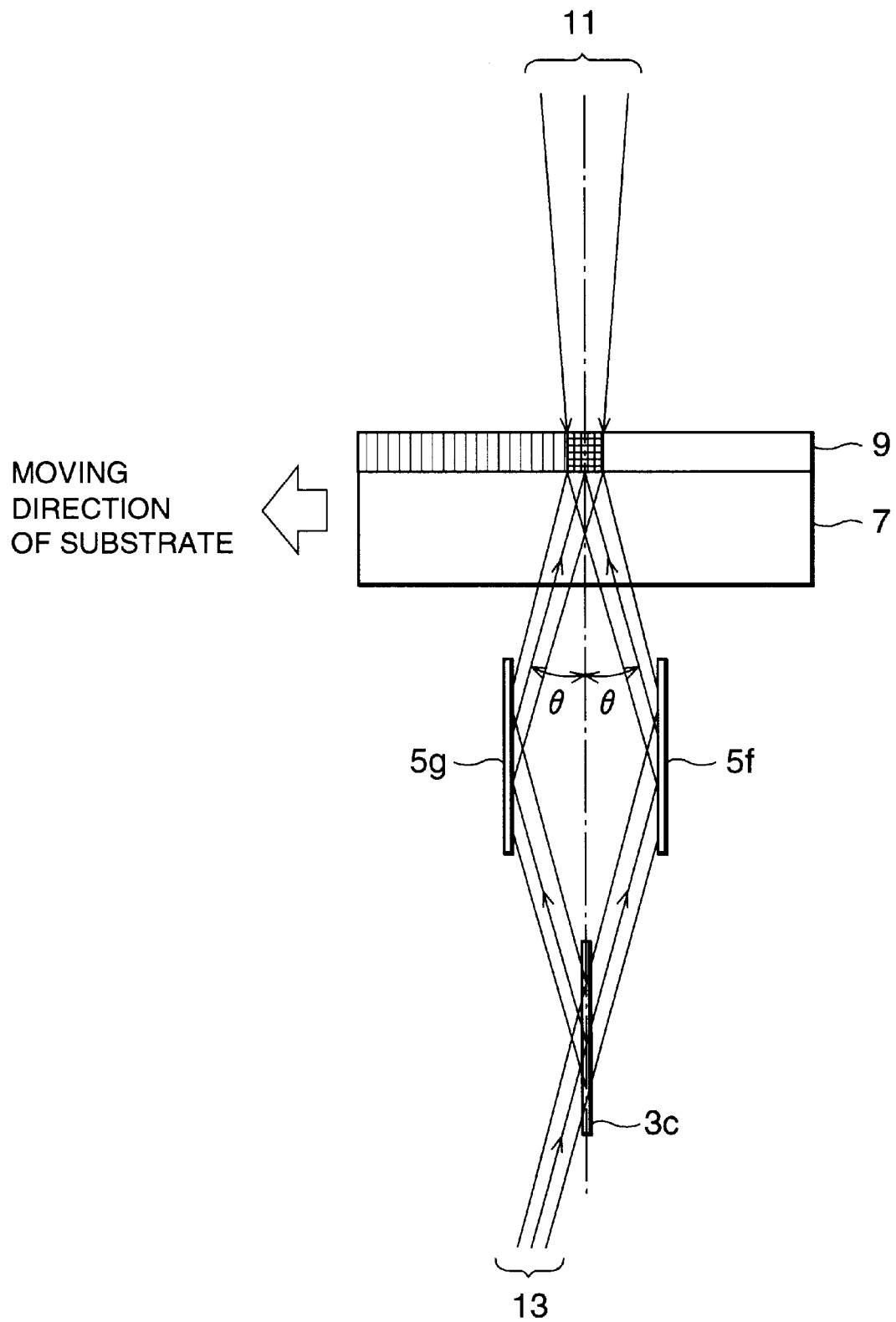
FIG. 13 is a front view showing a position relation (optical arrangement) between still the other laser light and the semiconductor film in the method for manufacturing the polycrystal semiconductor film according to the third aspect of the present invention.

FIG. 13 shows an optical arrangement of the laser beam application apparatus according to embodiment 5.

In this apparatus, the excimer laser beam 11 is vertically irradiated to the surface of the silicon film 9 on the glass substrate 7. On the other hand, the second laser beam 13 having a longer wavelength ($\lambda$) than the excimer laser beam 11 is split into two beams by using the beam splitter 3c so that each of the laser beams is irradiated from the rear surface of the glass substrate 7 at an incident angle $\theta$ on the excimer laser application part of the silicon film 9 by using reflection mirrors 5f and 5g so that the two beams are allowed to be interfered with each other and the standing wave is formed on the silicon film 9.

In this manner, an object of allowing the second laser light 13 to be incident from the rear surface of the glass substrate 7 is to prevent the silicon particles which jump out by heating from colliding with the optical system such as the reflection mirrors 5f and 5g.

At this time, when the outputs of the excimer laser beam 11 and the second laser beam 13 are set so that the low temperature part of this temperature distribution becomes not more than the melting point (1415° C.) and the high temperature part of the silicon becomes not less than the melting point, the residual nuclei can be formed only on the low temperature part of the standing wave.

Then, a crystal having a large grain diameter can be formed by forming the residual nuclei as a seed of crystal growth.

Incidentally, when the glass substrate as a whole is moved at a step not more than the beam width of the laser light at each time of laser application, the silicon film as a whole 9 can be recrystallized Embodiment 7

Embodiment 7 relates to a method for manufacturing the polycrysal semiconductor film according to the third embodiment of the present invention. Unlike embodiments 4 through 6, two laser beams is not allowed to intersect and to be interfered with each other so that the standing wave is formed on the surface of the semiconductor film. In embodiment 7, one laser beam in a straight line polarization state which is either parallel or vertical to the reflection surface is allowed to be slantly incident on the semiconductor film so that a standing wave having a cycle on the wavelength order ($\mu$m) on the surface of the semiconductor film with the interference of the surface scattered beam.

Then, like embodiments 4 through 6, the heat generation density distribution is formed which has the same cycle as the standing wave on the semiconductor film. At a low part of the heat generation density distribution corresponding to the valley part (knot part) of the standing wave, the melting of the nuclei is stabilized, the residual nuclei are controlled on the order of the wavelength ($\mu$m order) thereby making it possible to manufacture a polycrystal semiconductor film having a large crystal grain.

In the formation of the standing wave according to the embodiment, the surface roughness, which is formed after the melting and the recrystallization of the semiconductor film by the irradiation of the laser beam, becomes the starting point of the light scattering (light split).

The surface roughness basically arises from the density change in the solid-liquid state so that it can be considered that an uneven state is formed at the end of the solidification in the case where the solidification proceeds in a lengthwise direction and the crystal nuclei are grown.

Then, when the laser beam is again irradiated to the rough surface of this semiconductor film, the scattered beams which are scattered at the uneven part interferes with each other, and a standing wave is formed on the surface of the film. Consequently, at the multiple time irradiation, an uneven pattern having a specific cycle is finally formed during the repetition of this process (refer to J. Sipe, J. F.

Young, J. S. Perston, and H. M. van Driel, Phys, Rev. B 27, 1141, 1155, 2001, 1983).

Incidentally, according to the aforementioned documents, it has been confirmed that although the polarization state of the laser beam and the form of the standing wave which is generated on the surface of the semiconductor film widely change, a standing wave having a cycle of $\lambda/(1-\sin\theta)$ and $\lambda/(1+\sin\theta)$ is basically generated in a direction vertical to the polarization direction and a standing wave having a cycle of $\lambda/\cos\theta$ is basically generated in a direction parallel to the polarization direction.

In particular, it is known theoretically and experimentally that the standing wave having a cycle of $\lambda/(1+\sin\theta)$ is strong under a condition of the incident angle of vertical state of 35 or less, and that the standing wave having a cycle of $\lambda/\cos\theta$ is strong under a condition of the inclined incident angle of 35 or more and under a parallel polarization state to the reflection surface, that is, the P polarization.

Figure 14:
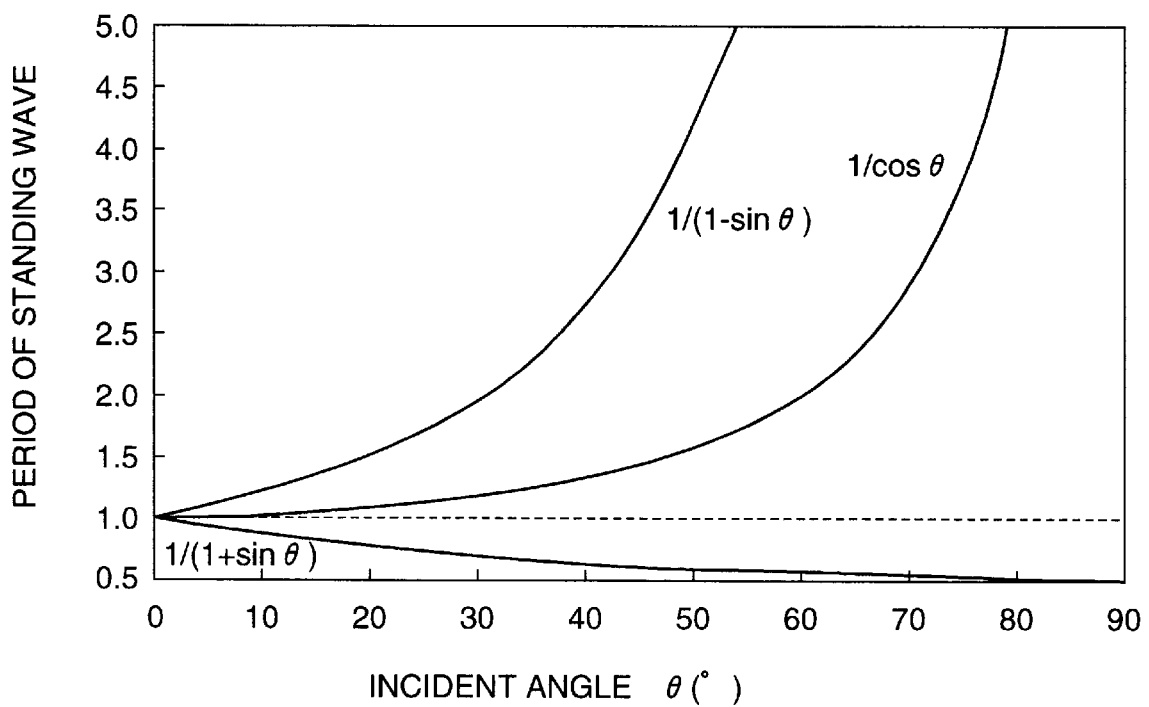
FIG. 14 is a view showing a relation between an incident angle formed between the laser beam and the semiconductor substrate and a cycle of a standing wave formed on the surface of the semiconductor film.

FIG. 14 shows the relation between the incident angle and the standing wave formed on the surface of the semiconductor film.

In FIG. 14, in the standing wave having a cycle of $\lambda/(1\pm\sin\theta)$, which is strong under a condition of the incident angle of near vertical state, a cycle of $\lambda/(1-\sin\theta)$ which is longer than the wavelength of the laser beam and a cycle of $\lambda/(1+\sin\theta)$ which is shorter than the wavelength of the laser beam are overlapped. On the other hand, the standing wave having a cycle of $\lambda/\cos\theta$ which is strong under a condition of the inclined incident angle and P polarization has a single cycle longer than the wavelength of the laser beam.

Since uniform crystal grains can be formed when the standing wave is uniform, it is desirable that the standing wave having a single cycle of $\lambda/\cos\theta$ is formed.

Here, in order to manufacture the polysilicon for TFT-LCD having a grain size of 1 to 10 μm the polycrystal semiconductor film according to the embodiment of the invention, the relation between the wavelength $\lambda$ of the laser light and the incident angle θ is shown in Table 3.

TABLE 3

Relation between Wavelength $\lambda$ of Laser Beam and Incident Angle θ

| Wavelength $\lambda$ of Laser Beam | Incident Angle θ |
|---|---|
| KrF laser (248 nm) | 76° ≦ θ ≦ 88.6° |
| XeCl laser (308 nm) | 72° ≦ θ ≦ 88.2° |
| Ar⁺ laser (514.5 nm) | 59° ≦ θ ≦ 87.1° |
| YAG laser (1060 nm) | 0° ≦ θ ≦ 84.3° |

Incidentally, the amplitude of the standing wave to be formed is determined from the polarizing degree of the incident laser beam and the incident angle thereof, and the optical constant and the surface form of the semiconductor film. Among them, although the polarizing degree, the incident angle, and the optical constant can be easily determined, but with respect to the surface form, it is difficult to determine for change and formation thereof during the repetition of the laser beam irradiation. Furthermore, along with the change and formation of the surface form, an intensity of the standing wave to be formed increases along with the change and formation of the surface form. Therefore, it is not easy to estimate the amplitude (intensity) of the standing wave.

Therefore, a constant surface form can be formed at a fewer irradiation times as the polarizing degree is higher.

As a consequence, a high polarizing degree is desirable for the formation of a strong standing wave. At least 10% polarizing degree is required, and more preferably, 90% or more is required.

In the aforementioned embodiment, an excimer laser single beam can be used as the second laser beam. However, the excimer laser beam is controlled with a high precision with respect to the shaping of the beam configuration, and uniformity thereof. Therefore, it is extremely difficult to control the incident angle. Consequently, other than the excimer laser, the second laser beam is separately provided which has a longer wavelength than the wavelength (200 to 400 nm), and the laser beam is irradiated in an overlapping manner to the application part of the excimer laser beam, and a standing wave having an arbitrary cycle can be formed on the semiconductor film by controlling the wavelength, the polarizing degree and the incident angle of the aforementioned second laser beam.

Figure 15A:
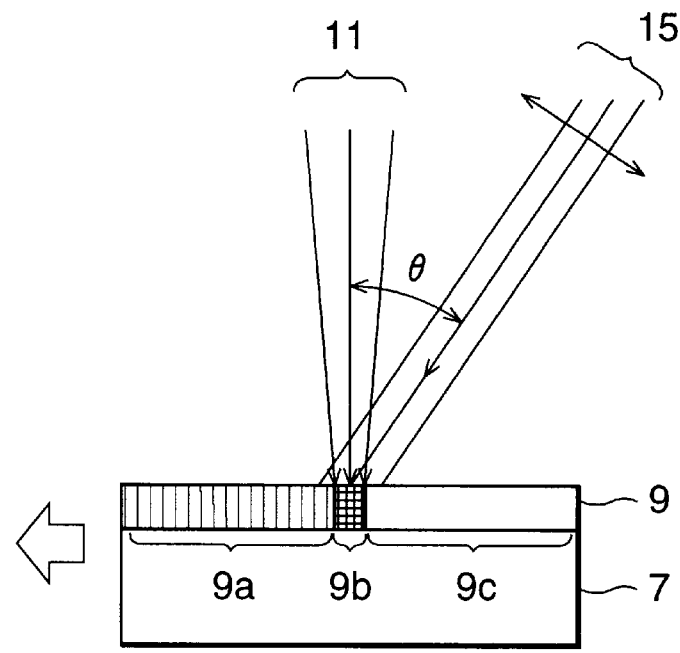
FIG. 15A and FIG. 15B are views showing a position relation (optical arrangement) in the method for manufacturing the polycrystal semiconductor film according to the third aspect of the present invention.
Figure 15B:
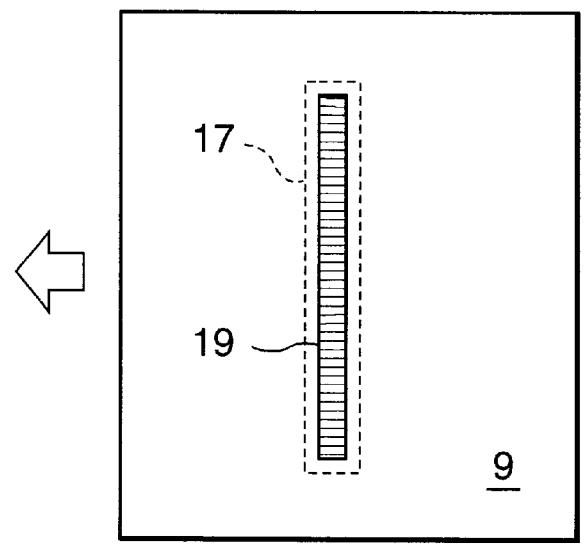

FIGS. 15A and 15B are views showing an optical arrangement of the laser beam apparatus for embodying the method for manufacturing the polycrystal semiconductor film according to the embodiment of the present invention.

FIG. 15A is a front view thereof, and FIG. 15B is a top view thereof.

In this apparatus, the excimer laser beam 11 is vertically irradiated to the surface of the silicon film 9 on the glass substrate 7. On the other hand, the second laser beam 15 which is a long wavelength light and a linear polarization is applied to the irradiation part of the excimer laser beam 11 of the silicon film 9 in the P polarization state. In the case where the excimer laser beam 11 is irradiated a plurality of times to repeat the melting and recrystallization of the silicon film 9, at the incident angle θ of the second laser light is 0°≦θ≦35° uneven configuration having a cycle of 1/(1−sinθ) and 1/(1+sinθ) is formed on the surface of the silicon film 9 in a vertical direction with respect to the polarizing direction. Furthermore, in the case of 35°≦θ, an uneven configuration having a cycle of 1/cosθ is formed on the surface of the silicon film in a direction vertical to the polarizing direction. As a consequence, the standing wave having the same cycle can be formed.

Then the heat generation density distribution having the same cycle is formed with this standing wave. Residual nuclei are formed at valley portions of this standing wave, and the residual nuclei are used as a seed of the crystal growth to be recrystallized with the result that a polysilicon film having an even and large grain diameter can be formed.

Incidentally, the total output of the two laser beams to be applied is set to a value less than the output at which the silicon film 9 is completely molten. At the same time, in the case where the output of the second laser beam 15 must be 1000/F % or more when the polarizing degree is denoted by F % (F>10). This is because it is necessary to have a polarizing degree of 10% or more with respect to the total output of laser.

As explained above, according to the method according to the third aspect of the present invention, when the semiconductor film is molten and recrystallized by the irradiation of the high energy pulse laser to form the polycrystal semiconductor film, the distribution of the residual nuclei which are present in the interface is controlled on an order of μm so that the stabilization of distribution can be obtained. Thus, the polycrystal semiconductor film having an even and large grain diameter can be obtained steadily. Consequently, the crystallinity of the polycrystal semiconductor film and the property of TFT element using the polycrystal semiconductor film can be improved.

Embodiment 8

With respect to the method for manufacturing the polycrystal semiconductor film according to the first, the second and the third aspect of the invention, a general comparison will be explained in which the method is individually executed and all the methods are executed in combination with each other.

Embodiment 8 will be explained with respect to FIGS. 16, 17, 18 and 19.

Figure 16:
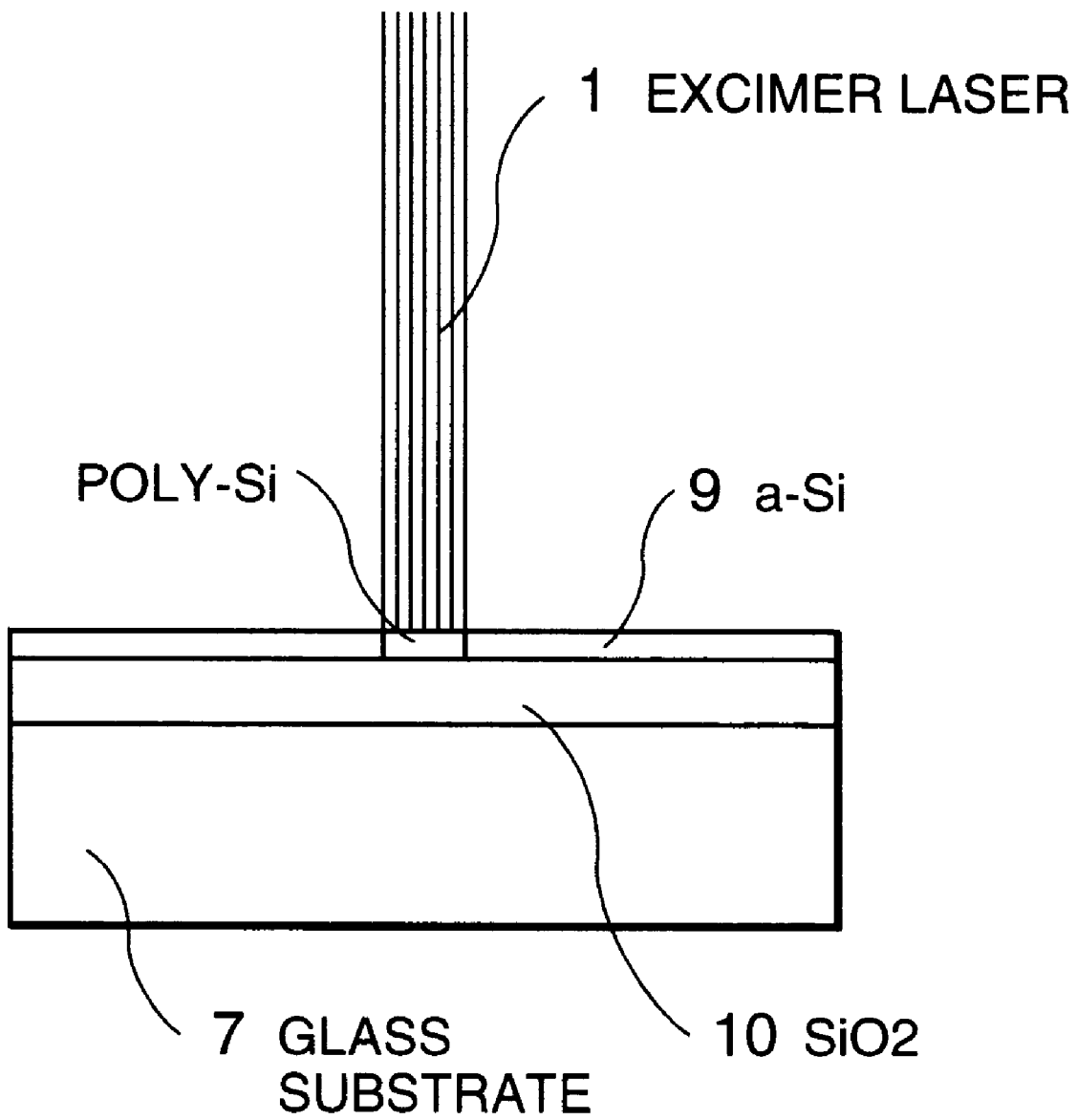
FIG. 16 is a view schematically showing a method for manufacturing a conventional polycrystal semiconductor film.

FIG. 16 is a view for explaining a conventional method for manufacturing the polycrystal semiconductor film, showing an apparatus for melting, solidifying and forming the polycrystal film by applying excimer laser onto the glass substrate, and the surface of the amorphous silicon film (a-Si film) which is formed on the $SiO_2$ base film provided thereon.

Figure 17:
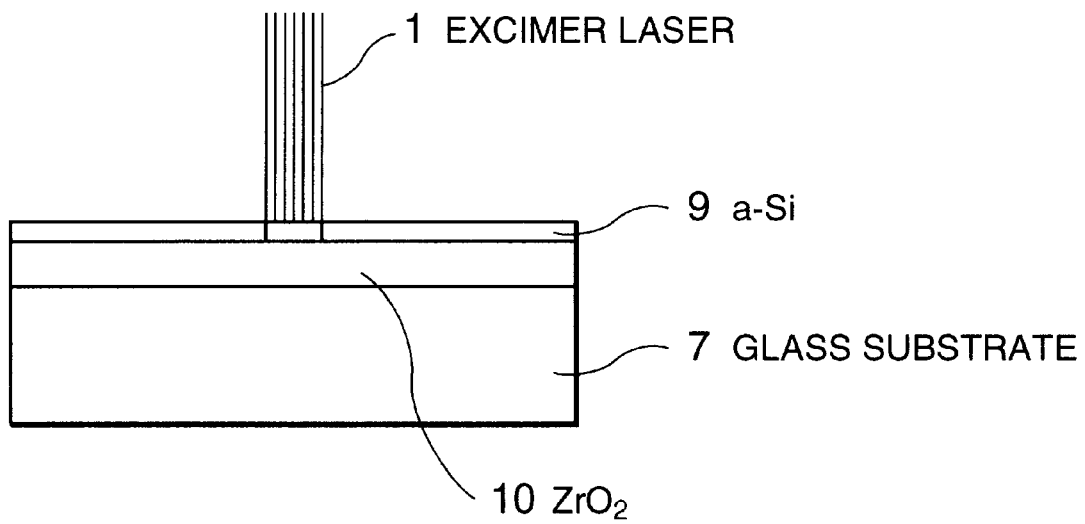
FIG. 17 is a view schematically showing a manufacturing method according to a second aspect of the invention.

FIG. 17 is a view for explaining the method corresponding to the embodiment 3 (the method according to the second aspect of the present invention). In the place of the conventional $SiO_2$ base film, $ZrO_2$ film is used as the base film.

Figure 18:
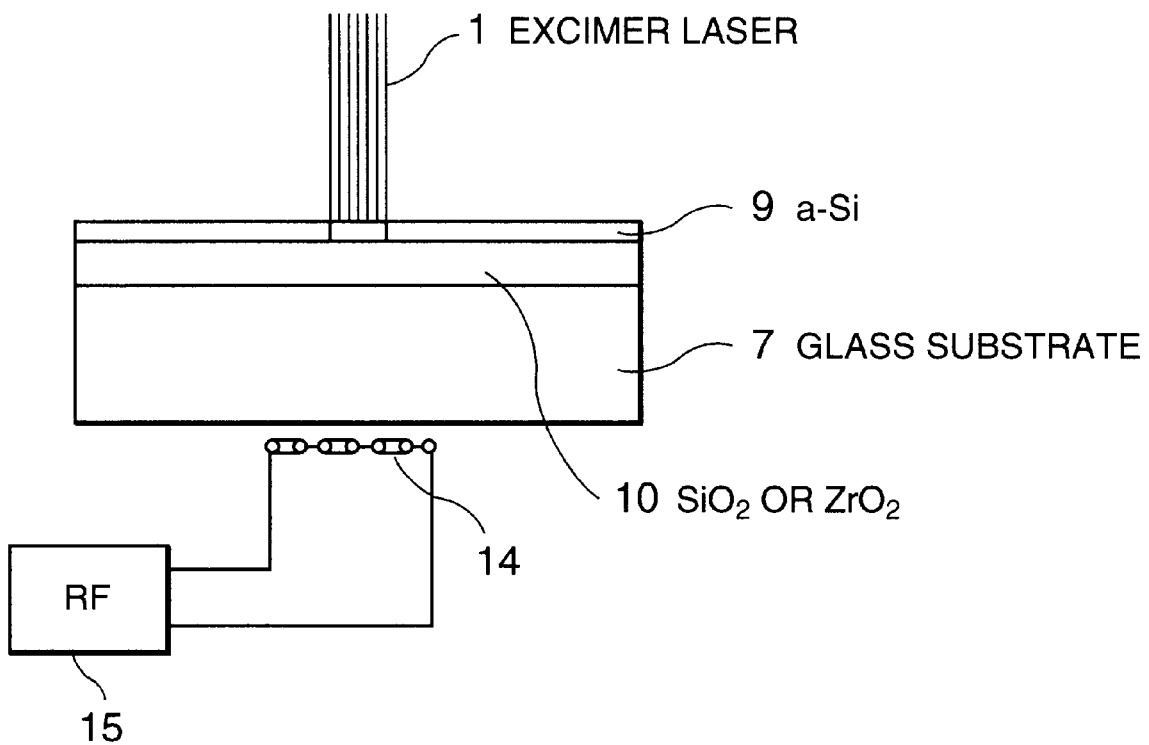
FIG. 18 is a view schematically showing a combination of the manufacturing method according to a first aspect of the invention and the manufacturing method according to a second aspect of the invention.

FIG. 18 is a view showing the method for manufacturing the polycrystal semiconductor film according to the first aspect of the invention in which the heating of the high frequency induction heating is added to the heating of the semiconductor film molten part in addition to the conventional method for manufacturing the polycrystal semiconductor film, or the method according to the second aspect of the present invention shown in FIG. 17.

Figure 19:
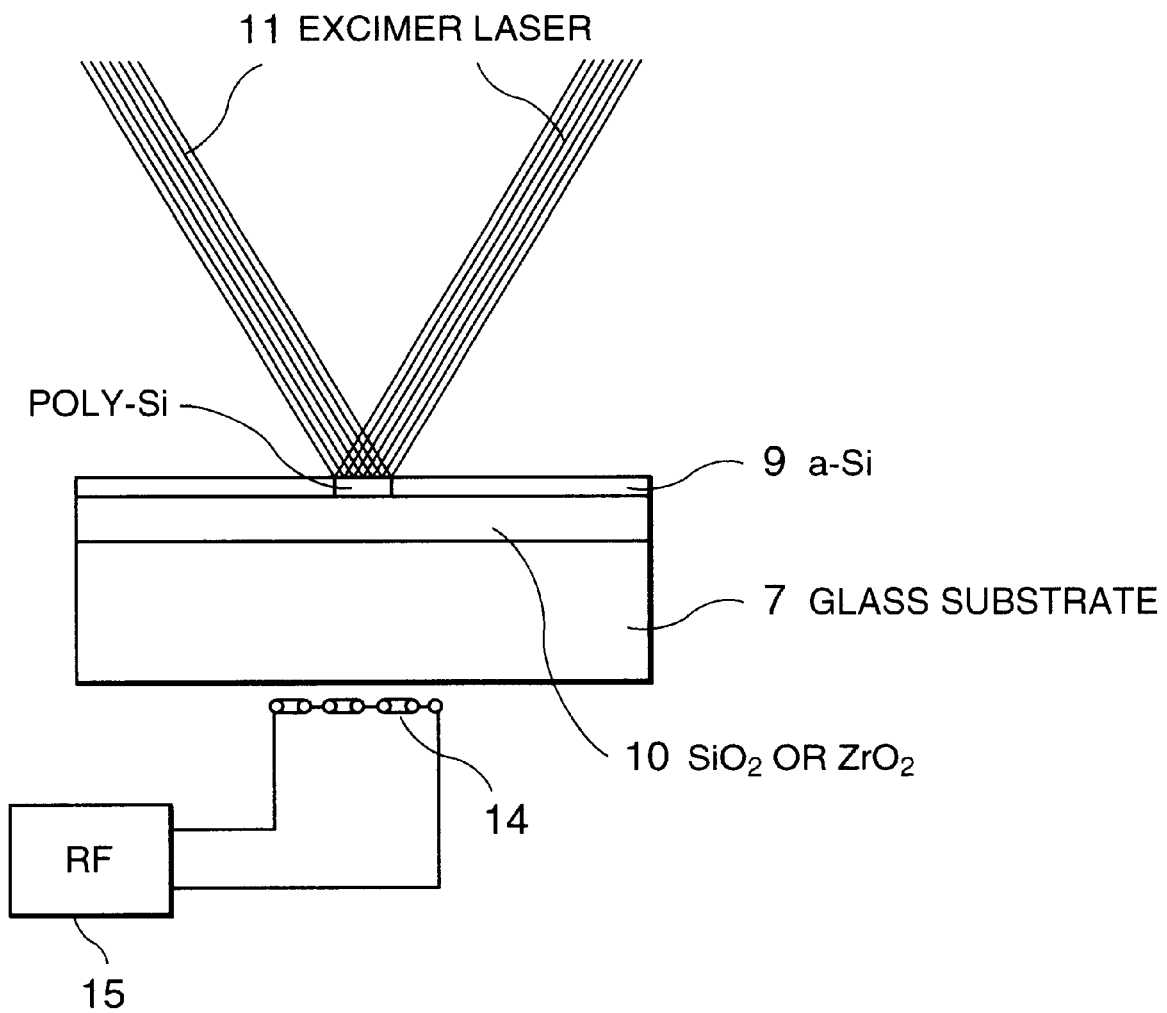
FIG. 19 is a view schematically showing a combination of the method for manufacturing the polycrystal semiconductor film according to the first, the second and the third aspects of the present invention.

FIG. 19 is a view showing a method in which the control of the interface crystal nuclei which is included in the method according to the third aspect of the invention is added to the aforementioned FIG. 18.

In other words, the advantage of enlarging the crystal grain diameter is compared with respect to the case of using the base film as the base film, the case of induction heating, and the case of controlling the crystal nuclei with the laser interference method.

Specifically, the XeCl excimer laser (having a pulse width of 20 nano second) is irradiated to the a-Si film (50 nm) on the $SiO_2$ base film (200 nm) on the glass substrate at 350 mJ/cm$^2$. The measurement result of the polysilicon grain diameter distribution is shown in Table 4 with respect to the case of forming the polysilicon film by the conventional method shown in FIG. 16, the case of using the heat insulating $ZrO_2$ film (200 nm) (FIG. 17), the case of heating the semiconductor film with the electromagnetic heating (FIG. 18) and the case of controlling the crystal nuclei with the laser interference method (FIG 19).

In the case of using the $ZrO_2$ base film, and in the case of heating the semiconductor film by electromagnetic heating, the optimal output of the excimer laser is 350 mJ/cm$_2$, and in the case of the laser interference method, the laser output before beam split has become 400 mJ/cm$_2$.

In the case of $ZrO_2$ film, the solidification time until the completion of the solidification in the case of heating the semiconductor film by electromagnetic induction will be as follows. In the case of measuring the solidification time by means of measuring the reflection rate by means of He—Ne laser, 100 nano sec is given in the case of using only $SiO_2$ film, whereas the solidification time can be prolonged to 150 nano sec by replacing the $SiO_2$ film with $ZrO_2$ film. Furthermore, in the case of heating the semiconductor film with a high frequency heating of 1MHz·5kW, the solidification time can be prolonged to approximately 200 nano sec. Furthermore, in the case of solidifying the semiconductor film with $ZrO_2$ base film, the solidification time can be prolonged to 250 nano sec.

Furthermore, in addition to the solidification time, in order to control the crystal nuclei distribution which reside at the interface with the base film, the solidification time does not change in the case of changing the interference width from 300 nm, 600 nm, and 1200 nm at an incident angle of the excimer laser.

As apparent from Table 4, in the case of using $ZrO_2$ base film and in the case of heating by the electromagnetic induction heating method, the maximum crystal grain diameter of polysilicon is enlarged together with the prolongation of the solidification time. However, in the case where the crystal nuclei distribution are not controlled, a large enlargement of the minimum diameter of crystal grains cannot be recognized.

In contrast, in the case where the interface crystal nuclei distribution is controlled using the laser interference method together with the solidification time prolongation method, it can be seen that the minimum grain diameter becomes close to the maximum grain diameter (the grain diameter distribution becomes narrow), by setting the distance between crystal nuclei to not exceed the maximum grain diameter which is determined by the solidification time. However, in the case of setting the distance between nuclei to exceed the maximum grain diameter determined by the solidification time, the crystal growth from the crystal nuclei does not overtake and supercooling state is generated, thereby fine crystals being generated.

Since the electric property of cross section panel such as TFT-LCD or the like is adjusted according to the lowest property part, the minimum grain diameter of the crystal grains determines the properties of panel. Consequently, in order to manufacture a high property TFT-LCD polysilicon, it is necessary to form polysilicon having a large grain diameter and a narrow distribution of grain diameter. As a material which satisfies the aforementioned condition, a method is desired which includes forming the crystal nuclei distance which is equal to the grain diameter which can be grown within the solidifying time with the laser interference method in addition to the solidification time which is sufficiently prolonged by using $ZrO_2$ base film, or by electromagnetic heating.

TABLE 4

| Prolongation of Solidification Time | Kind of Base Film Presense of Induction Heating | $SiO_2$ none | $ZrO_2$ none | $SiO_2$ present | $ZrO_2$ present |
|---|---|---|---|---|---|
| Solidification Time (nano second) | | 90 to 110 | 140 to 150 | 190 to 220 | 240 to 260 |
| | | Distribution nm) | | | |
| Distribution Control of | none | | 50 to 330 | 165 to 650 | 180 to 900 | 100 to 1200 |
| | | | present | | | |
| Crystal Nuclei | Interference Width 300 nm | 260 to 320 | 280 to 310 | 280 to 310 | 290 to 310 |
| | 600 nm | 60 to 330 | 500 to 610 | 550 to 630 | 550 to 650 |
| | 1200 nm | 55 to 320 | 60 to 660 | 90 to 910 | 1100 to 1250 |

As described above, in embodiment 8, it has been confirmed that the crystal grains can be uniformed and the size of the crystal grains can be enlarged by using the first, the second and the third methods in combination with respect to the method for manufacturing the polycrystal semiconductor film of the present invention.

As described above, the solidification time to the end of the solidification can be prolonged up in the process of manufacturing the polycrystal semiconductor film by melting, solidifying and crystallizing the semiconductor film by the irradiation of the high energy pulse laser, and the polycrystal semiconductor film having a large and uniform grain diameter can be manufactured by controlling the distribution of the residual nuclei which is present at the interface at the time of melting with the result that an attempt can be made to improve the crystallinity of the polycrystal semiconductor film and the TFT element using the semiconductor film.

What is claimed is:

1. A method for forming a polycrystal semiconductor film comprising the steps of:

irradiating a high energy pulse beam onto a surface of a semiconductor film comprising an amorphous or first polycrystal semiconductor formed on a first surface of a substrate to melt only the semiconductor film; and solidifying and forming the semiconductor film comprising a polycrystal with a large crystal grain diameter by passing through a solid-liquid coexisting state;

wherein only a liquid part generated by melting the semiconductor film is heated by using a difference in an electric resistance between a solid part and a liquid part in the solid-liquid coexisting state so as to prolong a solidification time until the completion of the solidification of the semiconductor film which has been molten; and wherein the molten part is heated with the electromagnetic induction heating, the induction heating being carried out by supplying a high frequency current to an induction heating coil provided on a second surface of the substrate to generate an alternate current in the semiconductor film.

2. The method for manufacturing the polycrystal semiconductor film according to claim 1, wherein a heat generation speed by the induction heating is lower than a heat dissipation speed to the substrate from the semiconductor film.

3. The method for manufacturing the polycrystal semiconductor film according to claim 1, wherein an electric field or a frequency is controlled for heating the semiconductor film with electromagnetic induction in synchronization with the high energy pulse beam irradiation, the heating of the electromagnetic induction heating being corrected in correspondence to a high resistance of the semiconductor film accompanying with the change of the ratio of the solid and the liquid during the progress of the solidification, with a constant heat generating state.

4. The method for manufacturing the polycrystal semiconductor film according to claim 1, wherein an area of a magnetic field generated by the electromagnetic induction is wider than an irradiated area by the high energy pulse beam so that only the liquid part is heated with the electromagnetic induction heating.

5. A method for manufacturing a polycrystal semiconductor film comprising the steps of:

irradiating a high energy pulse beam onto a surface of a semiconductor film comprising an amorphous or first polycrystal semiconductor formed on a first surface of a substrate to melt only the semiconductor film; and solidifying and forming the semiconductor film comprising a polycrystal with a large crystal grain diameter by passing through a solid-liquid coexisting state;

wherein only a liquid part generated by melting the semiconductor film is heated by using a difference in an electric resistance between a solid part and a liquid part in the solid-liquid coexisting state so as to prolong a solidification time until the completion of the solidification of the semiconductor film which has been molten; and wherein the heating of the liquid part is the electric heating, the heating being carried out by applying a voltage between conductors provided adjacent to the semiconductor film to subject to resistance-heating.

6. The method for manufacturing the polycrystal semiconductor film according to claim 5, wherein an area of electric heating of the semiconductor film is overlapped with an irradiation area by the high energy pulse beam.

7. The method for manufacturing the polycrystal semiconductor film according to claim 5, wherein the voltage is controlled for electric heating in synchronization with the high energy beam which is irradiated to the surface of the semiconductor film so as to correct a lowering of a heating efficiency due to an increase of resistance generated by the change of the ratio of the solid and liquid during the progress of the solidification.

8. A method for manufacturing a polycrystal semiconductor film comprising the steps of:

irradiating a high energy pulse beam to a semiconductor film comprising an amorphous or a first polycrystal semiconductor to melt the semiconductor film, and thereafter solidifying the film to form a polycrystal semiconductor film having an improved crystallinity, wherein a material having a melting point of 1600° C. or more and a thermal conductivity of 0.01 cal/cm.s.° C. at 1000° C. or less is used as a base film of the semiconductor film, and time up to the complete solidification of the semiconductor film can be prolonged by suppressing the heat dissipation from the molten film of the semiconductor to the substrate.

9. A method for manufacturing a polycrystal semiconductor film comprising the steps of:

irradiating a high energy pulse beam onto a surface of a semiconductor film comprising an amorphous or first polycrystal semiconductor formed on a first surface of a substrate to melt only the semiconductor film; and solidifying and forming the semiconductor film comprising a polycrystal with a large crystal grain diameter by passing through a solid-liquid coexisting state;

wherein only a liquid part generated by melting the semiconductor film is heated by using a difference in an electric resistance between a solid part and a liquid part in the solid-liquid coexisting state so as to prolong a solidification time until the completion of the solidification of the semiconductor film which has been molten; and wherein a material having a melting point of 1600° C. or more and a thermal conductivity of 0.01 cal/cm.s.° C. or less is used as a base film of the semiconductor film so as to prolong a solidification time until the complete solidification by suppressing heat dissipation from the molten liquid of the semiconductor film to the substrate.

10. A method for manufacturing a polycrystal semiconductor film comprising the steps of irradiating a high energy beam onto a semiconductor film comprising an amorphous semiconductor or a polycrystal semiconductor to melt the semiconductor film, and solidifying the semiconductor film via a solid and liquid coexisting state to form the polycrystal semiconductor, wherein the high energy beam is irradiating to form a standing wave at a predetermined position of the surface of the semiconductor, and to generate a heat density distribution having the same cycle as the standing wave at the predetermined position, thereby the semiconductor film being melted.

11. The method for manufacturing the polycrystal semiconductor film according to claim 10, wherein the standing wave is formed by irradiating at least two laser beams with incident angle capable of forming the standing wave to the semiconductor film.

12. The method for manufacturing the polycrystal semiconductor film according to claim 10, wherein the standing wave is formed by irradiating at least one laser beam at a predetermined incident angle and in the polarization state.

13. The method for manufacturing the polycrystal semiconductor film according to claim 10, wherein a cycle of the heat density distribution is set to 1 to 10 $\mu$m.

14. The method for manufacturing the polycrystal semiconductor film according to claim 10, wherein the method further comprises a step of prolonging a solidification time by using a difference in a electric resistance between the solid and the liquid in the solid and liquid coexisting state to heat only the liquid.

15. The method for manufacturing the polyscrystal semiconductor film according to claim 10, wherein a material having a melting point of 1600° C. and a thermal conductivity of 0.01 cal/cm.s.° C. is used as a base film of the semiconductor film to suppress heat dissipation from the molten liquid of the semiconductor to the substrate side so as to prolong a solidification time until the complete solidification.

16. The method for manufacturing the polycrystal semiconductor film according to claim 14, wherein a material having a melting point of 1600° C. and a thermal conductivity of 0.01 cal/cm.s.° C. is used as a base film of the semiconductor film to suppress heat dissipation from the molten liquid of the semiconductor to the substrate side so as to prolong a solidification time until the complete solidification.

17. The method for manufacturing the polycrystal semiconductor film according to claim 11, wherein a cycle of the heat density distribution is set to 1 to 10 $\mu$m.

18. The method for manufacturing the polycrystal semiconductor film according to claim 12, wherein a cycle of the heat density distribution is set to 1 to 10 82 $\mu$m.

* * * * *

UNITED STATES PATENT AND TRADEMARK OFFICE
CERTIFICATE OF CORRECTION

PATENT NO. : 5,970,368
DATED : October 19, 1999
INVENTOR(S) : Hideyuki SASAKI ET AL.

It is certified that error appears in the above-identified patent and that said Letters Patent is hereby corrected as shown below:

Col. 1, line 7, change "polycrysal" to --polycrystal--;

line 20, change "quarz" to --quartz--;

line 30, change "quarz" to --quartz--.

Col. 8, line 28, change "polycrysal" to --polycrystal--.

Signed and Sealed this

Twenty-second Day of May, 2001

Attest:

NICHOLAS P. GODICI

*Attesting Officer*  *Acting Director of the United States Patent and Trademark Office*